(12) United States Patent
Kushibiki et al.

(10) Patent No.: US 8,815,495 B2
(45) Date of Patent: Aug. 26, 2014

(54) PATTERN FORMING METHOD AND MANUFACTURING METHOD OF SEMICONDUCTOR DEVICE

(75) Inventors: Masato Kushibiki, Yamanashi (JP); Eiichi Nishimura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 427 days.

(21) Appl. No.: 12/877,218

(22) Filed: Sep. 8, 2010

(65) Prior Publication Data
US 2011/0065049 A1 Mar. 17, 2011

(30) Foreign Application Priority Data

Sep. 14, 2009 (JP) ................................. 2009-211819

(51) Int. Cl.
*G03F 7/40* (2006.01)
*H01L 21/02* (2006.01)
*G03F 7/039* (2006.01)
*H01L 21/033* (2006.01)
*H01L 21/311* (2006.01)
*G03F 7/20* (2006.01)
*G03F 7/004* (2006.01)
*H01L 21/316* (2006.01)
*H01L 21/314* (2006.01)

(52) U.S. Cl.
CPC ............ *G03F 7/20* (2013.01); *H01L 21/02164* (2013.01); *G03F 7/0397* (2013.01); *H01L 21/0337* (2013.01); *H01L 21/02274* (2013.01); *H01L 21/31116* (2013.01); *H01L 21/02115* (2013.01); *G03F 7/0045* (2013.01); *H01L 21/0338* (2013.01); *H01L 21/0228* (2013.01); *H01L 21/31138* (2013.01); *G03F 7/0046* (2013.01); *H01L 21/31608* (2013.01); *H01L 21/31144* (2013.01); *H01L 21/3146* (2013.01)
USPC .............................. 430/314; 430/315; 216/46

(58) Field of Classification Search
USPC ....................... 430/314, 315; 216/46
See application file for complete search history.

(56) References Cited

U.S. PATENT DOCUMENTS

2009/0087990 A1  4/2009  Yatsuda et al.

FOREIGN PATENT DOCUMENTS

JP   2009-099938   5/2009

*Primary Examiner* — Daborah Chacko Davis
(74) *Attorney, Agent, or Firm* — IPUSA, PLLC

(57) ABSTRACT

A disclosed mask pattern forming method includes isotropically coating a surface of a resist pattern array having a predetermined line width with a silicon oxide film, embedding a gap in the resist pattern array coated by the silicon oxide film with a carbon film, removing the carbon film from the upper portion and etching back the carbon film while leaving the carbon film within the gap in any order, removing the remaining carbon film and etching back the upper portion of the resist pattern array to have a predetermined film thickness in any order, and forming a first mask pattern array which has a center portion having a predetermined width and film sidewall portions sandwiching the predetermined width, and arranged interposing a space width substantially the same as the predetermined line width with an asking process provided to the resist pattern array exposed from the removed silicon oxide film.

15 Claims, 23 Drawing Sheets

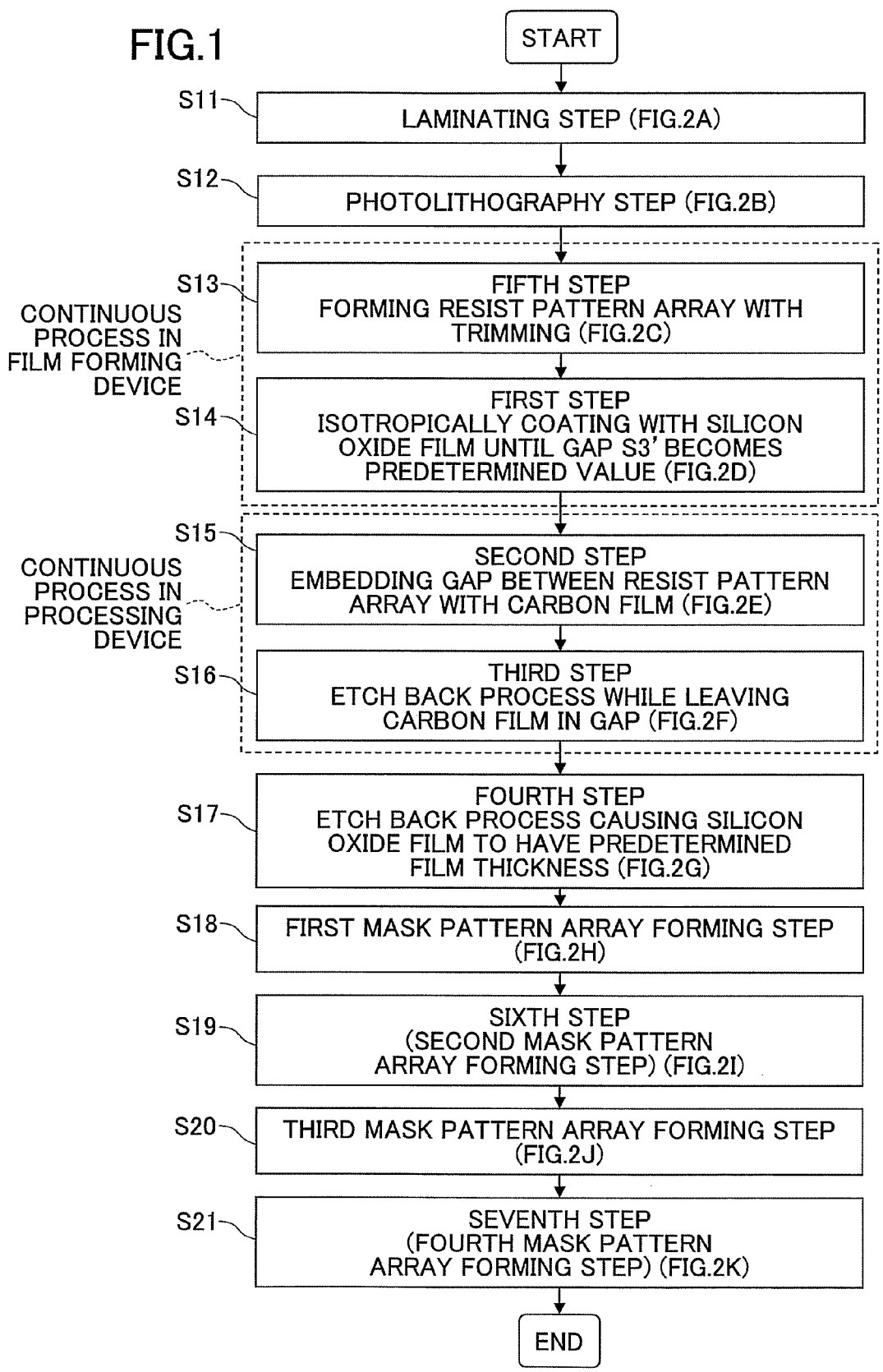

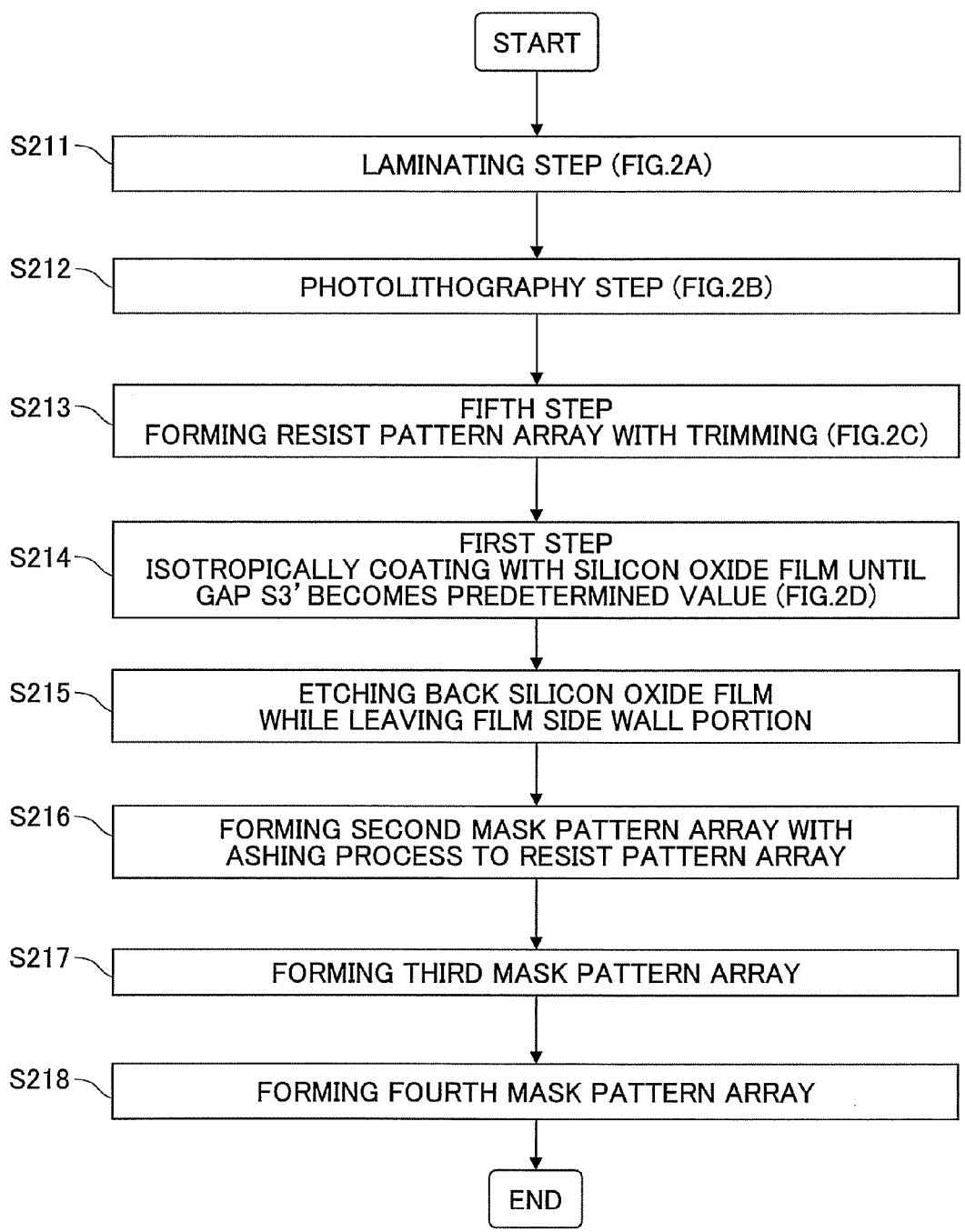

FIG.7A
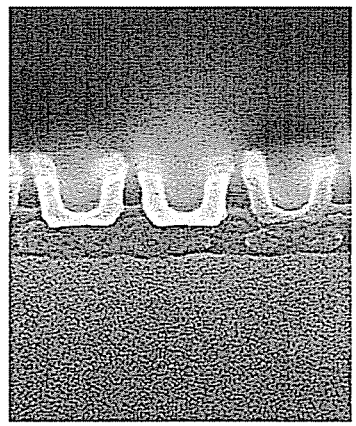 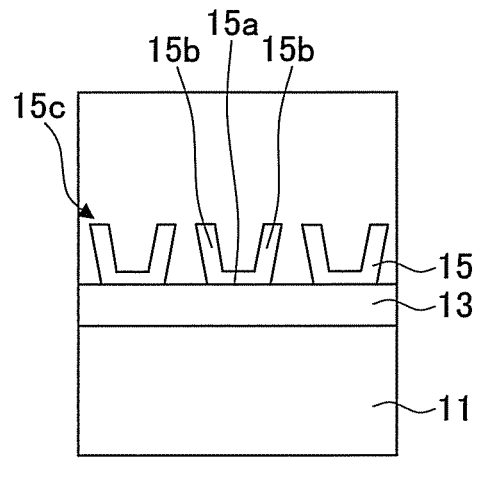
FIG.7B
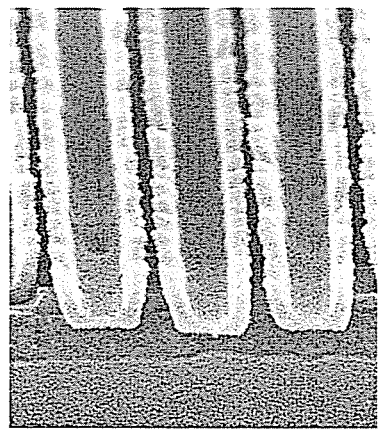 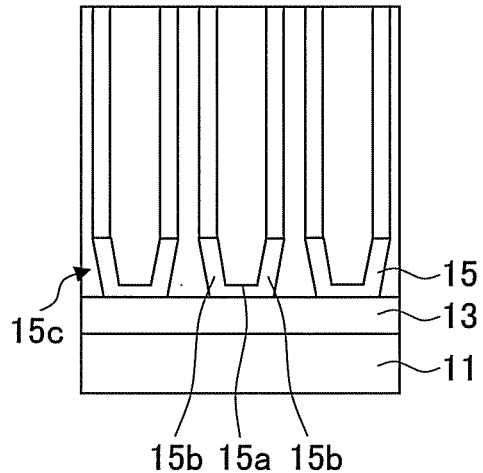

FIG.8A
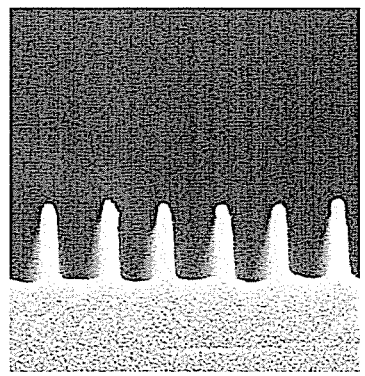 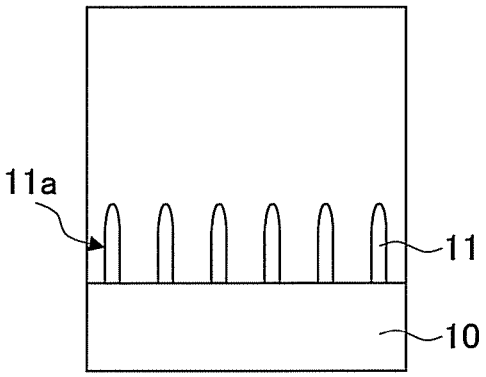
FIG.8B
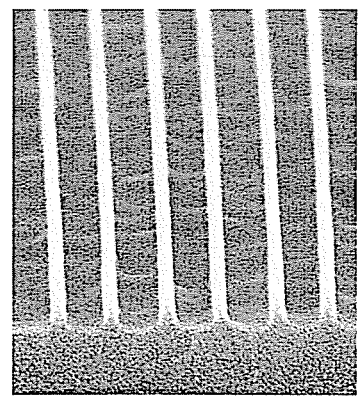 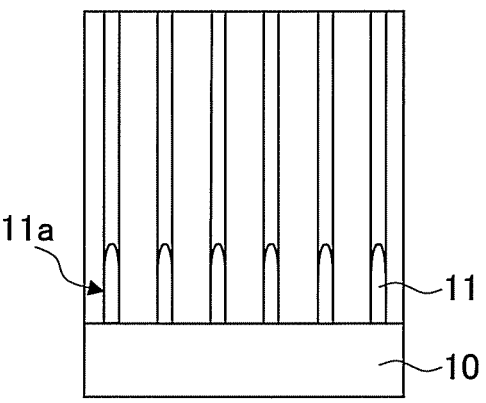

FIG.10B
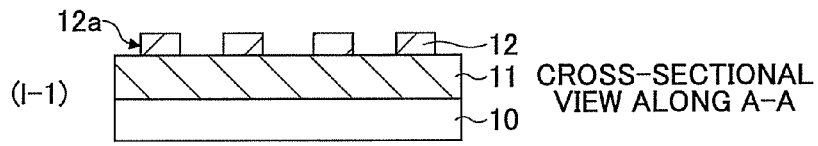
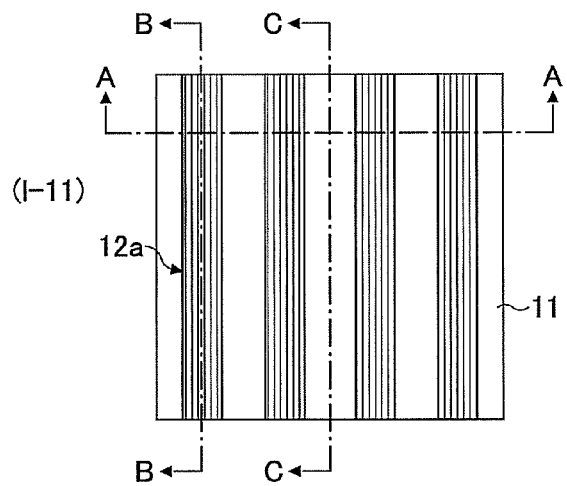
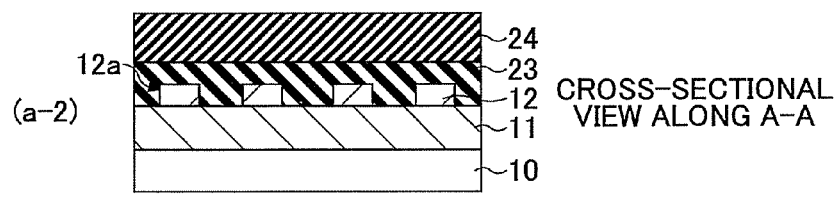
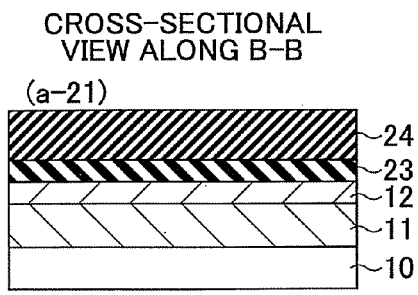
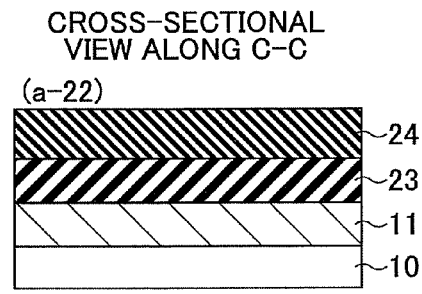

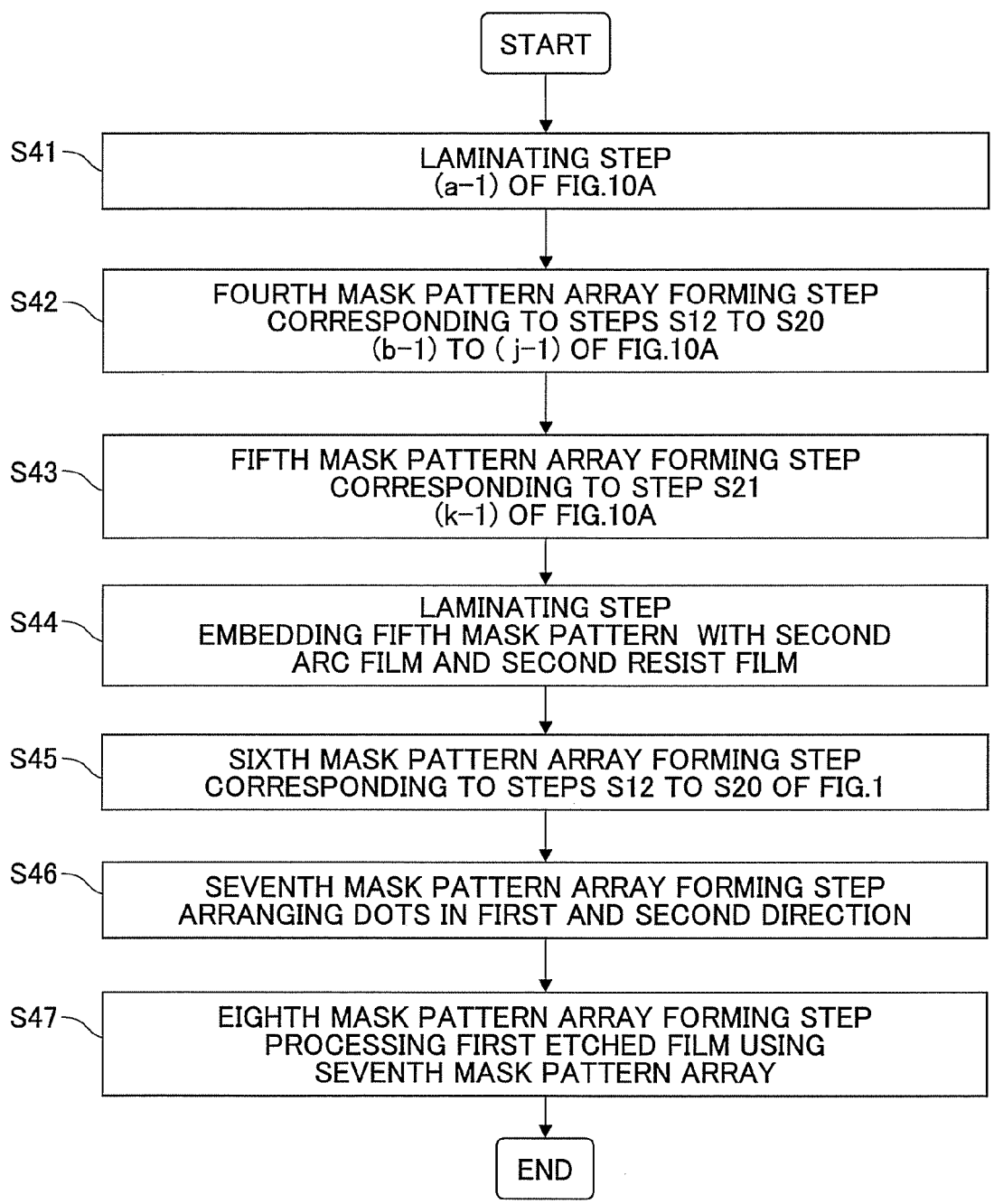

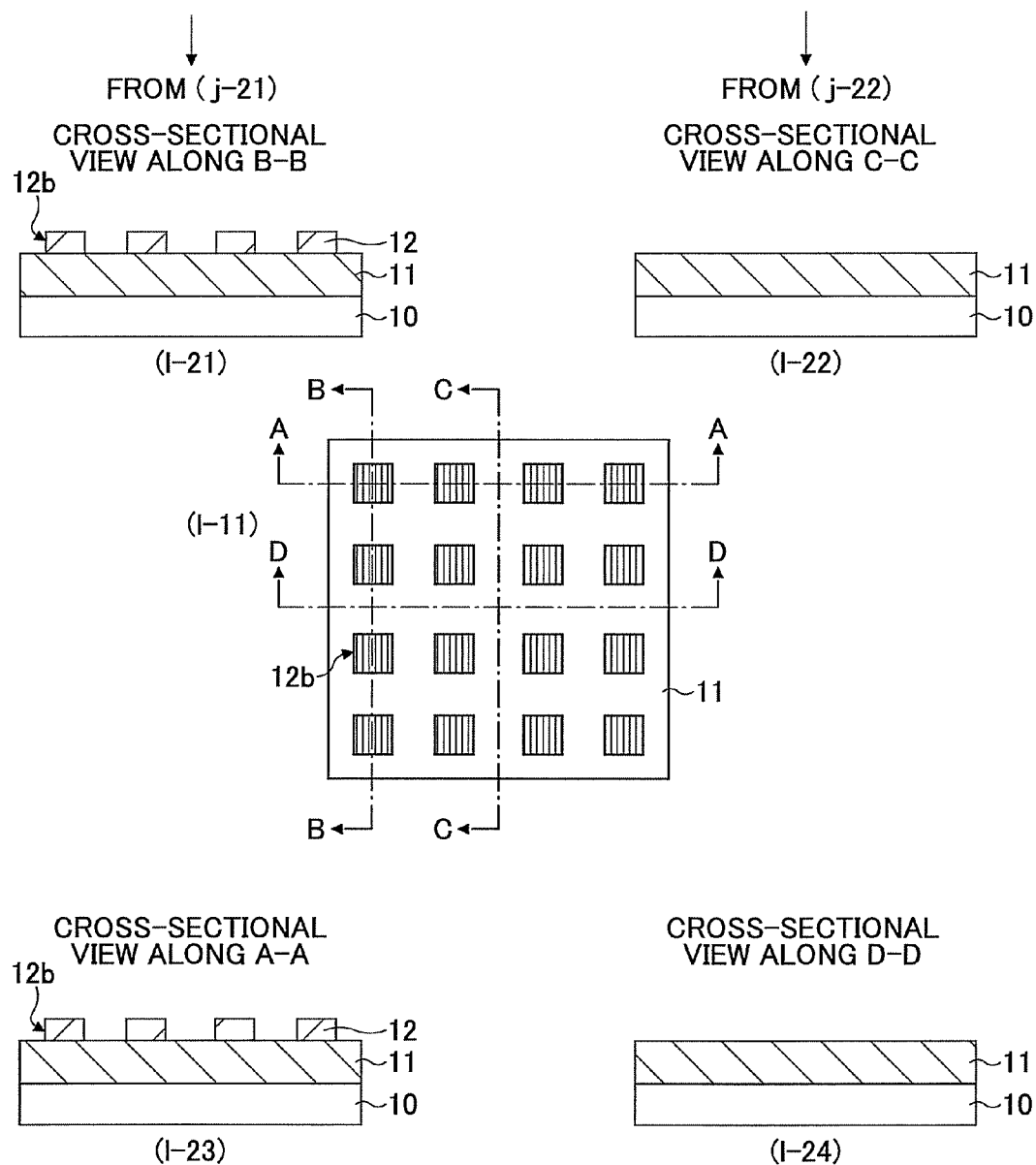

PATTERN FORMING METHOD AND MANUFACTURING METHOD OF SEMICONDUCTOR DEVICE

CROSS-REFERENCE TO RELATED APPLICATIONS

This patent application is based upon and claims the benefit of priority of Japanese Patent Application No. 2009-211819 filed on Sep. 14, 2009, the entire contents of which are incorporated herein by reference.

BACKGROUND OF THE INVENTION

1. Field of the Invention

The present invention generally relates to a manufacturing method of a semiconductor device and a mask pattern forming method for forming a mask pattern included in the semiconductor device 2. Description of the Related Art Patterns of wiring and separation width required in a manufacturing process tend to be miniaturized along with tendency of semiconductor devices to have higher integration. Such miniaturization is realized by forming a resist pattern using a photolithographic technique and etching a film to be etched which is various foundation thin films using the resist pattern as a mask pattern. In order to form the mask pattern, the photolithographic technique is important. The size in the recent miniaturization of semiconductor devices is required to be less than a resolution limit of the photolithographic technique.

So-called double patterning may be a method of providing the size less than the resolution limit of the photolithographic technique. The double patterning method is to form a mask pattern having a line width and a space width respectively narrower than a case where the mask pattern is formed with one patterning by providing patterning of two stages including a first mask pattern forming step and a second pattern forming step carried out after the first mask pattern forming step.

As one example of the double patterning method, there is known a method of forming a mask pattern having a pitch smaller than an original resist pattern array using a side wall patterning (SWP) method in which the film sidewall portions formed on both sides of a pattern are used as a mask. First, a photo resist film is formed to shape a resist pattern array in which line portions are arranged, and a silicon oxide film or the like is formed to isotropically cover a surface of the resist pattern array. Thereafter, the photo resist film is etched back to leave only the film side wall portions covering the side walls of the resist pattern array. Thereafter, the resist pattern arrays are removed. As a result, the silicon oxide films serving as the remaining film sidewall portions become a mask pattern as described in, for example, Patent Document 1.

However, when a mask pattern having a size smaller than the resolution limit of the photolithographic technique is formed by the method of SWP, there may be the following problems.

In the above mask pattern forming method, a bottom anti-reflecting coating (hereinafter, referred to as "anti-reflective coating film") formed as a lower layer of the resist film used for photolithography is etched after forming the resist pattern array. By etching the anti-reflective coating film, the number of the processes increases and the cost may increase.

Further, it is preferable to enhance an etching rate (selected ratio) of the anti-reflective coating film with respect to the resist film when the anti-reflective coating film is etched. Therefore, it is impossible to use a hard material for the anti-reflective coating film, and the variety of the materials of the anti-reflective coating films is limited. Therefore, there may be a case where the production cost increases.

In order to facilitate etching of the anti-reflective coating film, it is impossible to increase the thickness of the anti-reflective coating film. Therefore, it is impossible to make the etched film, being the lower film of the anti-reflective coating film, function as a hard mask effective for etching the etched film, which is positioned lower than the anti-reflective coating film.

In the above mask pattern forming method, when the anti-reflective coating film is not etched, there may be a case where the silicon oxide film is formed to cover the resist pattern array, the film side wall portion of the silicon oxide film is left as the resist pattern array to etch back, and the pattern made of the film sidewall portion of the silicon oxide film is formed by removing the resist pattern array with ashing. However, when the resist pattern array is removed with ashing, there may be a case where the anti-reflective coating film exposed when the silicon oxide film is etched back is eroded with ashing. The anti-reflective coating film is eroded not only in the film thickness direction but also in directions parallel to the film surface of the anti-reflective coating film. Therefore, the mask pattern made from the film sidewall portion may fall down, referred to as so-called pattern collapse. [Patent Document 1] Japanese Laid-open Patent Publication No. 2009-99938.

SUMMARY OF THE INVENTION

Accordingly, embodiments of the present invention may provide a novel and useful mask pattern forming method and manufacturing method of a semiconductor device and by which an etching process of an anti-reflective coating film can be omitted when a minute mask pattern is formed by SWP, the anti-reflective coating film is used as a mask pattern effective for etching the anti-reflective coating film as the etched film, and it is possible to prevent the mask pattern from collapsing, thereby solving one or more of the problems discussed above.

More specifically, the embodiments of the present invention may provide a mask pattern forming method including a first step of isotropically coating a surface of a resist pattern array which is formed on an anti-reflective coating film and has a predetermined line width with a silicon oxide film until a gap in the resist pattern array becomes a predetermined size; a second step of embedding the gap in the resist pattern array coated by the silicon oxide film with a carbon film and coating an upper portion of the resist pattern array coated by the silicon oxide film with the carbon film; a third step of removing the carbon film from the upper portion of the resist pattern array coated by the silicon oxide film and etching back the carbon film while leaving the carbon film within the gap in the resist pattern array coated by the silicon oxide film, wherein the removing and etching back is carried out in any order; a fourth step of removing the remaining carbon film and etching back the upper portion of the resist pattern array to have a predetermined film thickness, wherein the removing and etching back is carried out in any order; a first mask pattern array forming step of forming a first mask pattern array which is made of the silicon oxide film, has a center portion having a predetermined width and film sidewall portions sandwiching the predetermined width of the center portion, and alternately arranged with a space width substantially the same as the predetermined line width on the anti-reflective coating film provided by an ashing process applied to the resist pattern array exposed from the removed silicon oxide film.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 1 is a flowchart for explaining a mask pattern forming method and a manufacturing method of a semiconductor device of Embodiment 1.

FIG. 5 is a flowchart for explaining a mask pattern forming method and a manufacturing method of a semiconductor device of Comparative Example 2.

FIG. 7A is a photo and a schematic view of a first mask pattern array after step S18 in Embodiment 1.

FIG. 7B is a photo and a schematic view in plan of the first mask pattern array after step S18 in Embodiment 1.

FIG. 8A is a photo and a schematic view of a fourth mask pattern array after step S21 in Embodiment 1.

FIG. 8B is a photo and a schematic view in plan of the fourth mask pattern array after step S21 in Embodiment 1.

FIG. 10B schematically illustrates the structure of the substrate surface in the mask pattern forming method and the manufacturing method of the semiconductor device of Embodiment 2.

FIG. 11 is a flowchart for explaining a mask pattern forming method and a manufacturing method of a semiconductor device of a modified example of Embodiment 2.

FIG. 12A schematically illustrates a structure of the substrate surface in the mask pattern forming method and the manufacturing method of the semiconductor device of the modified example of Embodiment 2.

DETAILED DESCRIPTION OF THE PREFERRED EMBODIMENTS

A description is given below, with reference to the FIG. 1 through FIG. 12B of embodiments of the present invention. Reference symbols typically designate as follows:
10: Substrate;
11: First film to be etched;
12: Second film to be etched;

13: First anti-reflective coating film;
14: first resist film;
15, 25: silicon oxide film;
16, 26: carbon film;
23: second anti-reflective coating film; and
24: second resist film Embodiment 1

Figure 2A:
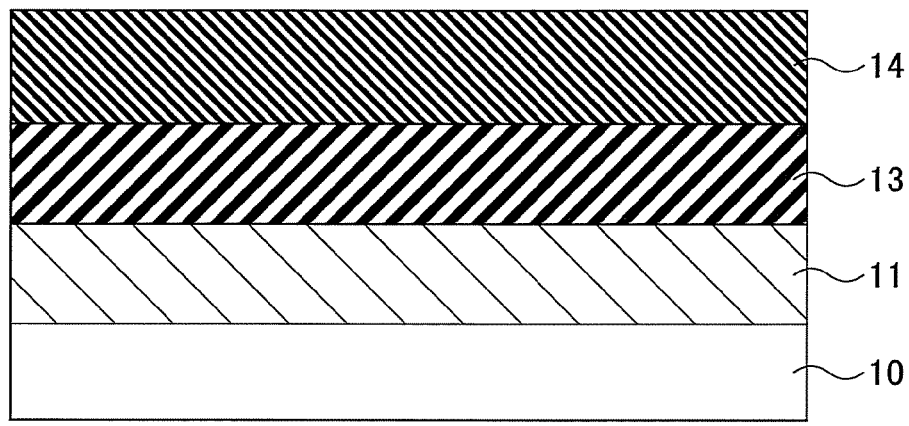
FIG. 2A schematically illustrates a structure of the substrate surface in the mask pattern forming method and the manufacturing method of the semiconductor device.
Figure 2B:
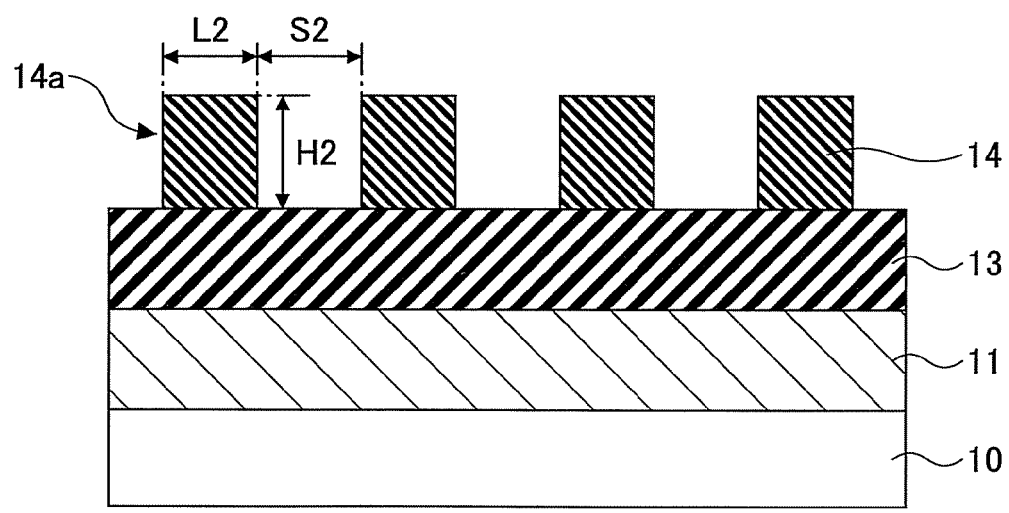
FIG. 2B schematically illustrates the structure of the substrate surface in the mask pattern forming method and the manufacturing method of the semiconductor device.
Figure 2C:
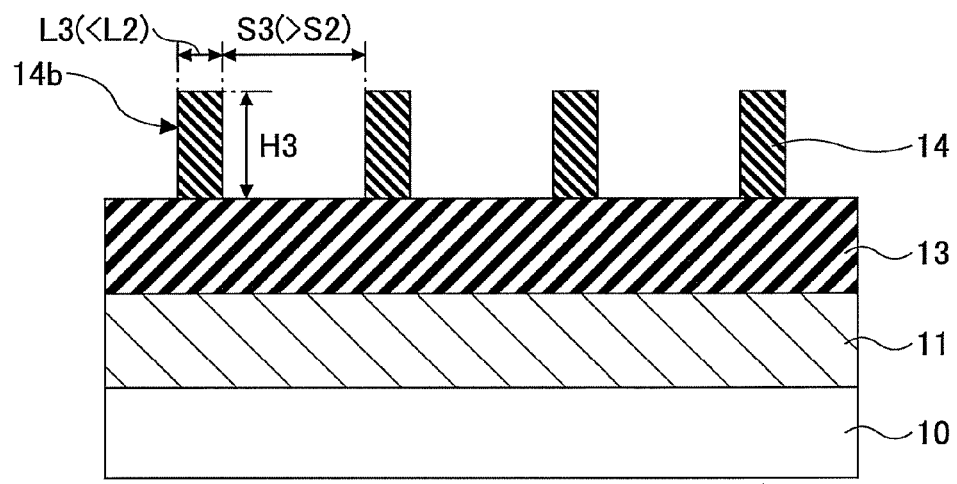
FIG. 2C schematically illustrates the structure of the substrate surface in the mask pattern forming method and the manufacturing method of the semiconductor device.
Figure 2D:
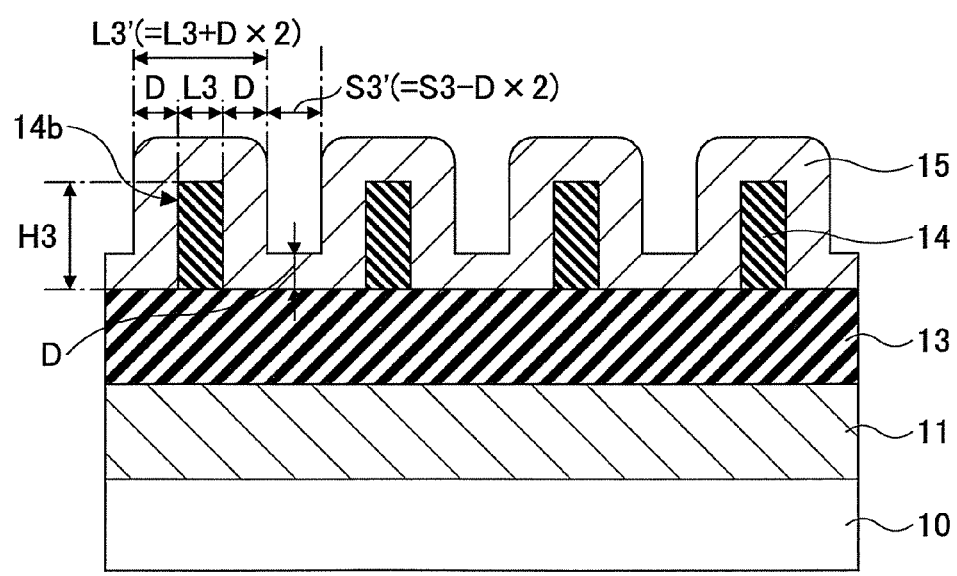
FIG. 2D schematically illustrates a structure of the substrate surface in the mask pattern forming method and the manufacturing method of the semiconductor device.
Figure 2E:
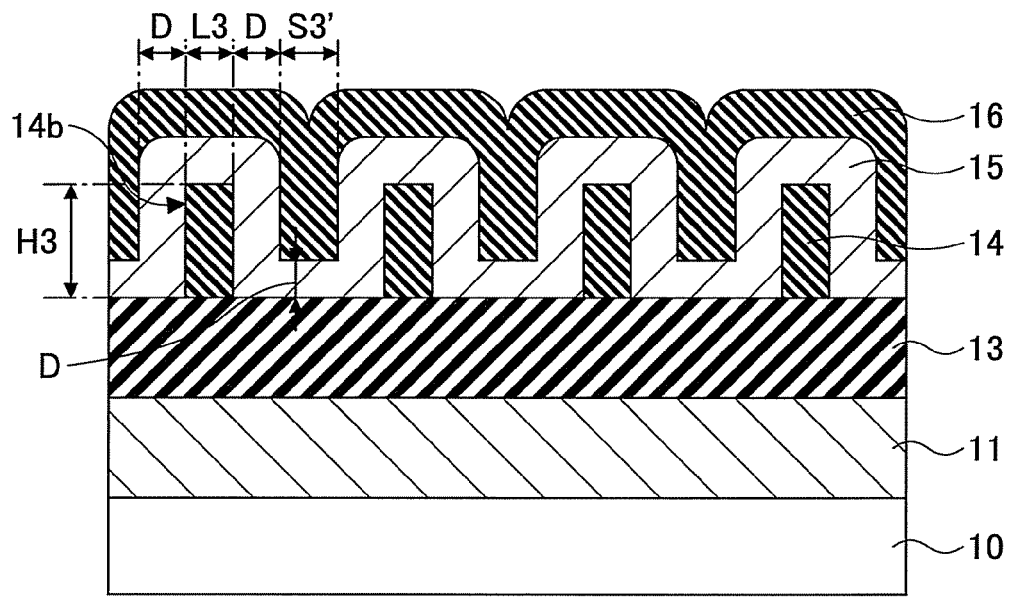
FIG. 2E schematically illustrates a structure of the substrate surface in the mask pattern forming method and the manufacturing method of the semiconductor device.
Figure 2F:
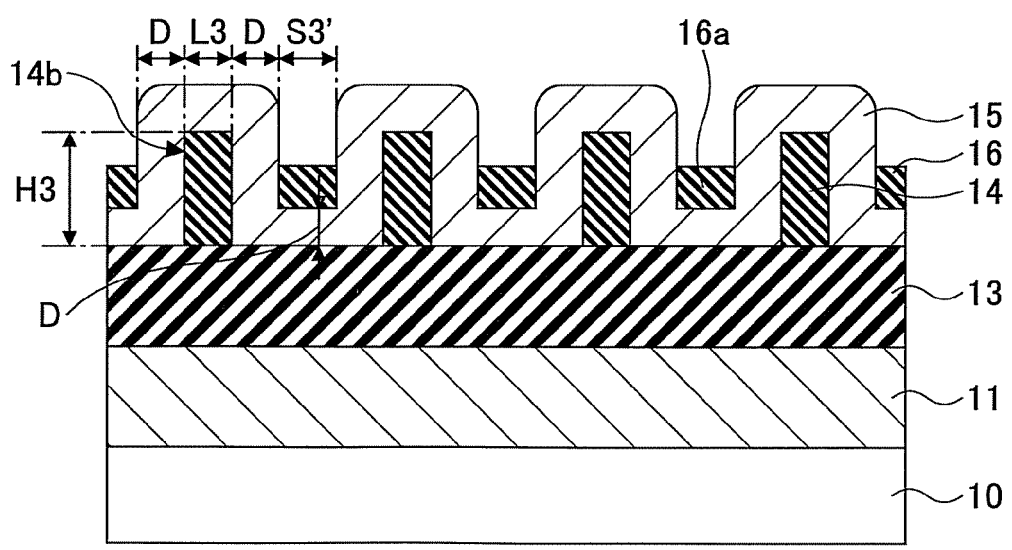
FIG. 2F schematically illustrates a structure of the substrate surface in the mask pattern forming method and the manufacturing method of the semiconductor device.
Figure 2G:
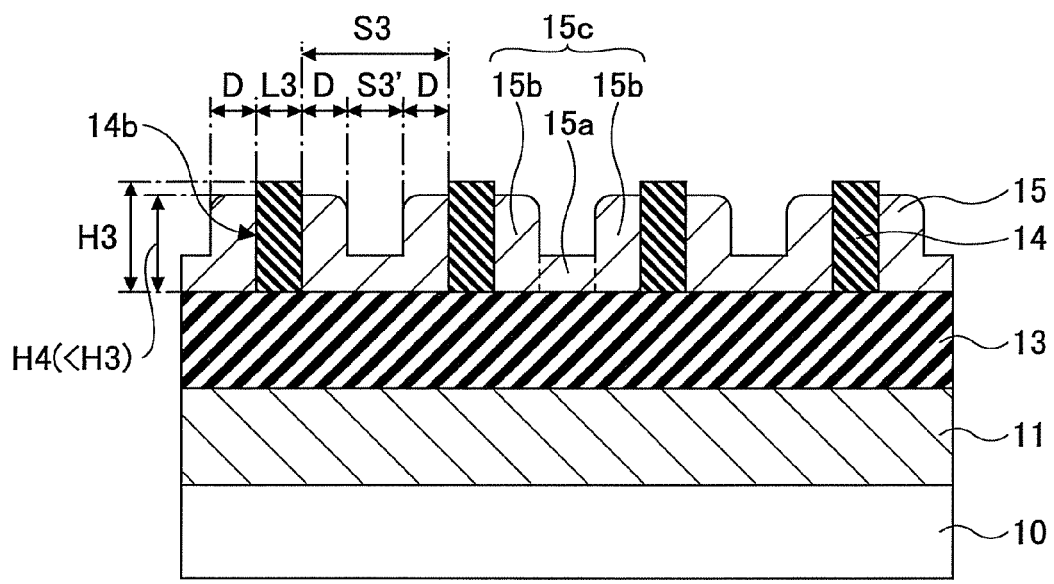
FIG. 2G schematically illustrates a structure of the substrate surface in the mask pattern forming method and the manufacturing method of the semiconductor device.
Figure 2H:
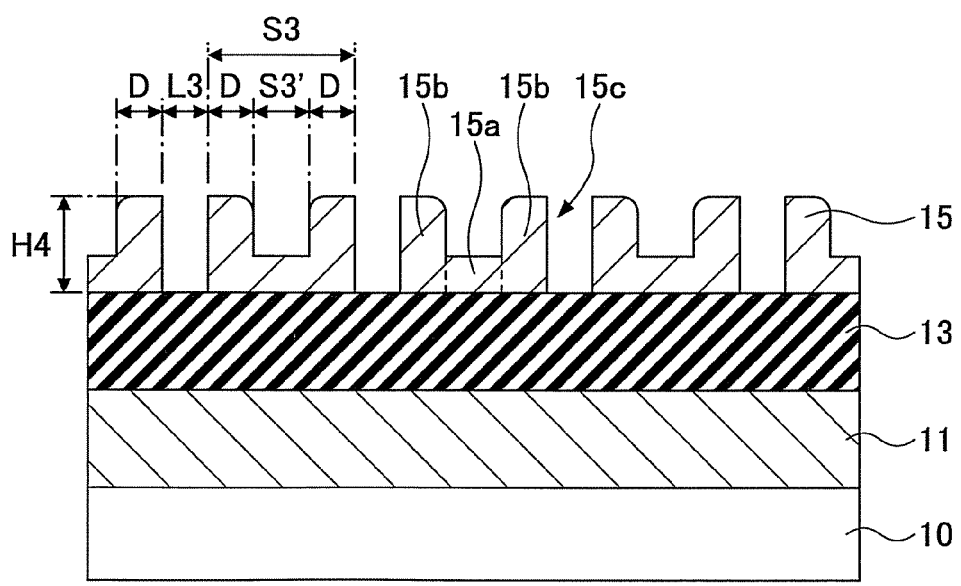
FIG. 2H schematically illustrates a structure of the substrate surface in the mask pattern forming method and the manufacturing method of the semiconductor device.
Figure 2I:
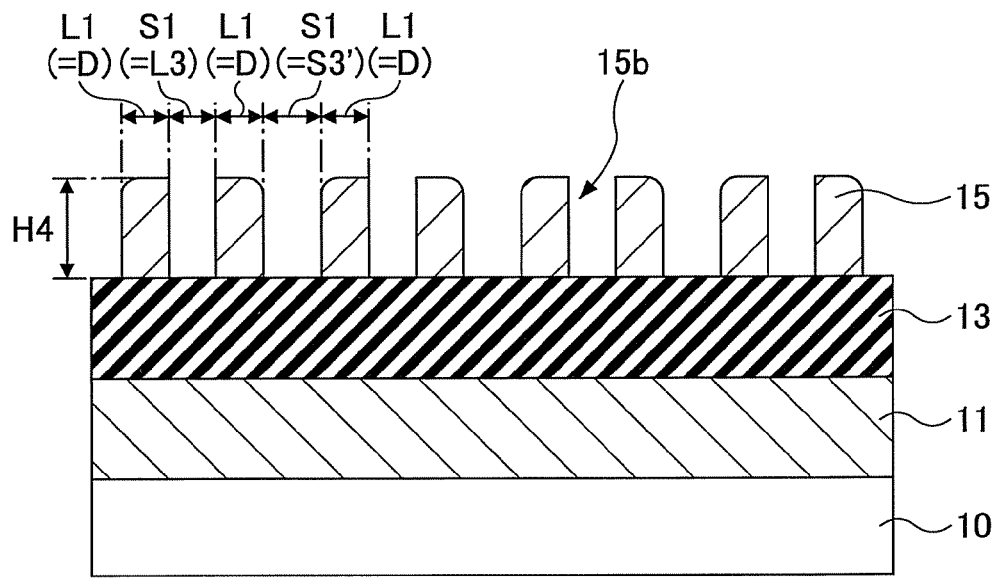
FIG. 2I schematically illustrates a structure of the substrate surface in the mask pattern forming method and the manufacturing method of the semiconductor device.
Figure 2J:
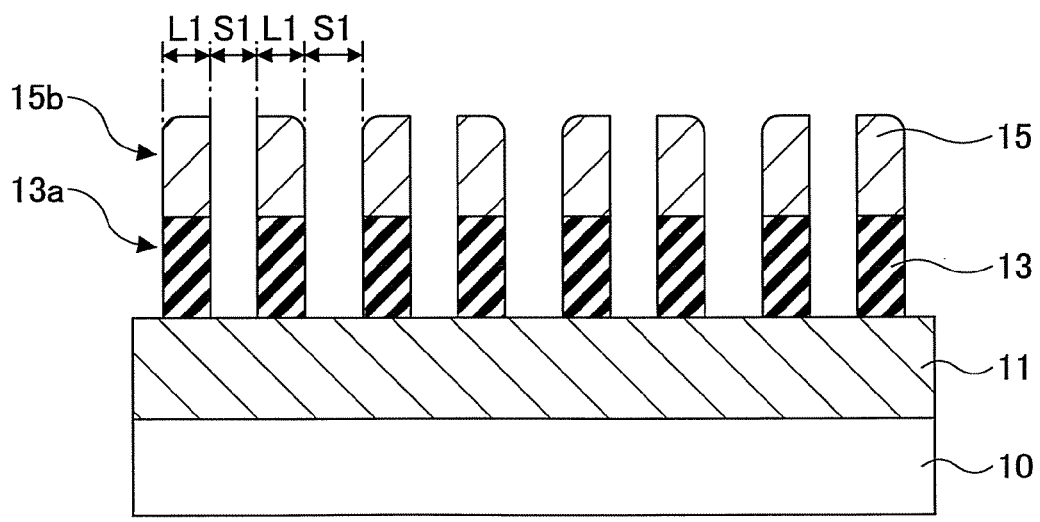
FIG. 2J schematically illustrates a structure of the substrate surface in the mask pattern forming method and the manufacturing method of the semiconductor device.
Figure 2K:
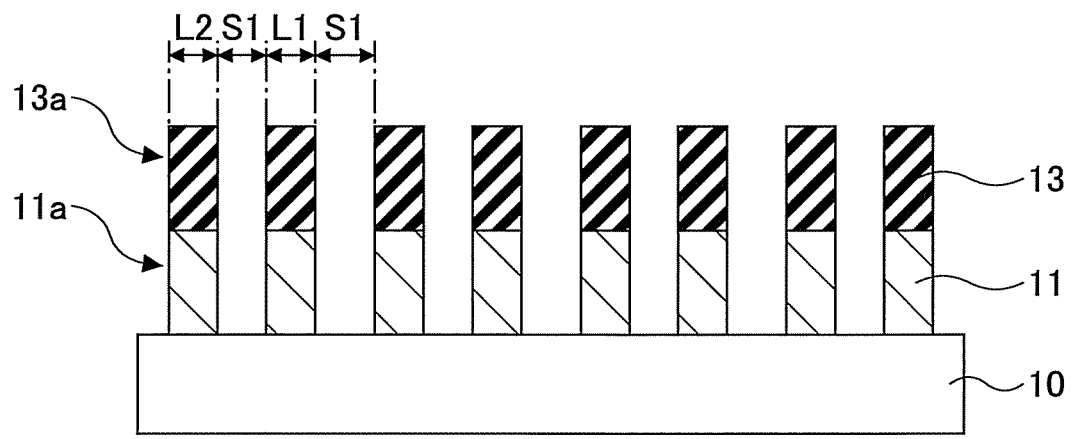
FIG. 2K schematically illustrates a structure of the substrate surface in the mask pattern forming method and the manufacturing method of the semiconductor device.

Referring to FIG. 1 to FIG. 2K, a mask pattern forming method and a manufacturing method of a semiconductor device of Embodiment 1 are described. FIG. 1 is a flowchart for explaining the mask pattern forming method and the manufacturing method of the semiconductor device of Embodiment 1. FIG. 2A to FIG. 2kK schematically illustrate structures of the substrate surfaces in the manufacturing methods of the semiconductor devices and the mask pattern forming methods. The structures of the substrates surfaces after the processes of step S11 to step S21 are carried out correspond to the cross-sectional views of FIG. 2A to FIG. 2K.

Referring to FIG. 1, a micro pattern forming method of Embodiment 1 includes a laminating step in step S11, a photolithography step in step S12, a fifth step in step S13, a first step in step S14, a second step in step S15, a third step in step S16, a fourth step in step S17, a first mask pattern array forming step in step S18, a sixth step in step S19, a third mask pattern array forming step in step S20, and a seventh mask pattern array forming step in step S21.

The micro pattern forming method of Embodiment 1 may be separated into a mask pattern forming method including steps S11 to S19 and a manufacturing method of a semiconductor device including steps S20 to S21.

Referring to FIG. 1, the fifth step in step S13 and the first step in step S14 may be continuously carried out in a film forming device which forms a silicon oxide film. The second step in step S15 and the third step in step S16 may be continuously carried out in a processing device in which a carbon film is etched back.

First, the laminating step of step S11 is carried out. In step S11, as illustrated in FIG. 2A, the etched film 11, the anti-reflective coating film 13 and the resist film 14 are sequentially formed and upwardly laminated on the substrate 10. The etched film 11 in which a pattern is formed functions as a mask used in various processes. The anti-reflective coating film 13 in which a pattern is formed functions as a mask for forming the pattern of the etched film 11. The anti-reflective coating film 13 further functions as an anti-reflective coating film (BARC: Bottom Anti-Reflecting Coating) which is used for carrying out photolithography of the resist film 14 to be formed on the anti-reflective coating film 13.

The substrate 10 does not only designate a semiconductor substrate such as a silicon substrate but also a structure in which a conductive film corresponding to a semiconductor element or an integrated circuit pattern which is formed inside or on the semiconductor substrate and an interlayer insulating film for insulating the conductive film.

The material of the etched film 11 may be silicon nitride, silicon oxide, silicon oxynitride, amorphous silicon, or polysilicon. The thickness of the etched film 11 is, for example, 20 to 200 nm.

The material of the anti-reflective coating film 13 may be various organic materials including polyphenol formed by spin-on or a photoresist such as i-electron beam resist. The thickness of the anti-reflective coating film 13 is, for example, 150 to 300 nm.

Next, the photolithography step of step S12 is carried out. In step S12, the resist film 14 is exposed by a photolithographic technique and developed to thereby form a pattern 14a having the line width L2, the space width S2 and the height H2.

The material of the resist film 14 is, for example, an ArF resist. The height H2 is not specifically limited and may be 50 to 200 nm. Both the line width L2 and the space width S2 may be 60 nm.

Next, the fifth step of step S13 is carried out. In step S13, the pattern 14a made of the resist film 14 is slimmed to make the shape of the pattern 14a have a predetermined line width and form the resist pattern array 14b as illustrated in FIG. 2C.

This process of slimming the pattern 14a is referred to as trimming.

The process of slimming is not specifically limited. For example, the process of slimming is carried out under an atmosphere including an oxygen radical or an ozone gas and a temperature up to 100 degree C. As illustrated in FIG. 2B and FIG. 2C, the line width L3 of the resist pattern array 14b becomes narrower in comparison with the line width L2 of the pattern 14a before slimming the pattern 14a, the magnitude relationships among the line width L3, the space width S3 of the resist pattern array 14b and the line width L2 and the space width S2 of the pattern 14a are L3<L2 and S3>S2. The line width L3 may be 30 nm, and the space width S3 may be 90 nm.

The height H3 of the resist pattern array 14b may be the same as the height H2 of the pattern 14a or smaller than the height H2 of the pattern 14a.

Step S13 may be carried out inside a treatment container in the film forming device for step S14. Next, the first step of step S14 is carried out. Referring to FIG. 2D, the silicon oxide film 15 is formed in step S14 to isotropically coat the surface of the resist pattern array 14b which has been formed on the anti-reflective coating film 13 and slimmed to have the predetermined line width L3 with the silicon oxide film 15 until gaps between adjacent arrays of the resist pattern array becomes a predetermined value S3'.

The silicon oxide film may be an $SiO_2$ film, an $SiO_x$ film having a composition ratio between oxygen and silicon being different from that of the $SiO_2$ film, or any other film having another film having major components of oxygen and silicon. For example, the silicon oxynitride film (SiON film) may be used.

The silicon oxide film 15 is formed while the resist film 14 is left as the resist pattern array 14b. It is preferable to form the resist film 14 at a low temperature (e.g. 300 degree C. or less) because the resist film 14 is ordinarily weak against a high temperature. It is sufficient that the silicon oxide film is formed at a low temperature. In Embodiment 1, it is possible to carry out step S14 with a low temperature molecular layer deposition (hereinafter, referred to as MLD). As a result, referring to FIG. 2D, the silicon oxide film 15 is formed on the entire surface of the substrate 10 including portions in which the resist pattern array 14b is formed and portions in which the resist pattern array 14b is not formed. The silicon oxide film 15 is formed to cover the side surfaces of the resist pattern array 14b. Provided that the thickness of the silicon oxide film 15 is D, the width of the silicon oxide film 15 covering the side surfaces of the resist pattern array 14b becomes D. Therefore, the gap S3' of the adjacent resist pattern arrays becomes S3'=S3−D×2. Further, the thickness D of the silicon oxide film 15 may be 30 nm, and the space width S3 may be 90 nm. In this case, the predetermined value S3' becomes 30 nm.

The film forming step using low temperature MLD is described next.

In the low temperature MLD, a process in which a row gas containing silicon is supplied to the treatment container of the film forming device and the substrate adsorbs the raw material of the silicon and a process in which a gas containing oxygen is supplied into the treatment container and the raw material of the silicon is oxidized are alternately repeated.

Specifically, in the process in which the substrate adsorbs the raw material of the silicon, the raw material is aminosilane gas containing two amino groups in one molecule such as a bis(tertiary-butylaminosilane), hereinafter referred to as BTBAS, is supplied into the treatment container for a predetermined time. Thus, BTBAS is adsorbed on the substrate.

Next, the gas containing oxygen is supplied into the treatment container. In the process of oxidizing the silicon material, plasma $O_2$ gas obtained by the plasma generating mechanism having a high frequency source is supplied into the treatment container for a predetermined time. Therefore, BTBAS adsorbed on the substrate is oxidized to thereby form the silicon oxide film.

When the process in which the substrate adsorbs the raw material of the silicon and the process in which the raw material of the silicon is oxidized are alternately repeated, it is possible to add a process of evacuating the inside of the treatment container and simultaneously supplying a purge gas for a predetermined time. The purge gas may be an inactive gas such as a nitrogen gas. It is sufficient to remove the remaining gas inside the treatment container. Therefore, it is possible to continuously evacuate under a state in which supplies of all gases are stopped (the supply of the purge gas is also stopped).

In Embodiment 1, an Si source gas contains organic silicon for forming the silicon oxide film 15. An example of the Si source gas is a precursor of aminosilane. An example of the precursor of aminosilane is a monovalent or divalent precursor of aminosilane. Examples of the monovalent or divalent precursor of aminosilane are bis(tertiary-butylaminosilane) (BTBAS), bis(diethylaminosilane) (BDMAS), bis(diethylaminosilane) (BDEAS), dipropylaminosilane (DPAS), butylaminosilane (BAS), and diisopropylaminosilane (DIPAS).

A trivalent precursor of aminosilane may be used as the precursor of aminosilane. An example of the precursor of aminosilane is tri(dimethylaminosilane) (TDMAS).

Further, the Si source gas containing the organic silicon may be a precursor of ethoxysilane in addition to the precursor of aminosilane. An example of the precursor of ethoxysilane may be tetraethoxysilane (TEOS).

The gas containing oxygen may be an $O_2$ gas, a NO gas, a $N_2O$ gas, a $H_2O$ gas, or a $O_3$ gas. These gases are changed to plasma using a high frequency electric field so as to be used as an oxidant. By using the plasma of these gases, the silicon oxide film may be formed at a temperature of 300 degree C. or less. By further adjusting the gas flow rate of the gas containing oxygen, the electric power of the high frequency electric field, and the pressure inside the treatment container, it is possible to form the silicon oxide film at a temperature of 100 degree C. or less or at room temperature.

Next, the second step of step S14 is carried out. Referring to FIG. 2E, the gaps in the resist pattern array 14b coated with the silicon oxide film 15 are embedded by the carbon film 16, and an upper portion of the resist pattern array 14b coated with the silicon oxide film 15 are coated by the carbon film 16. The film thickness of the carbon film 16 may be determined to enable embedding the gaps in the resist pattern array 14b coated with the silicon oxide film 15.

A carbon film containing amorphous carbon may be used as the carbon film 16. The second step in step S15 may be continuously carried out in connection with step S16 in a processing device which etches back the carbon film in the third step in step S16.

A film forming method of using an amorphous carbon film in the processing device which etches back the carbon film 16 is described next.

When the amorphous carbon film is formed, the processing device having a carbon source gas supplying unit connected via a carbon source gas supplying tube and a treatment container having a plasma generating container is used. A predetermined carbon source gas is supplied inside the treatment container of the processing device from a carbon source gas supplying source via the carbon source gas supplying tube, the supplied carbon source gas is changed to plasma, and the amorphous carbon film 16 is formed on the substrate 10 coated by the silicon oxide film 15 with plasma CVD. It is possible to supply a nitrogen gas into the treatment container via the purge gas supplying tube from the purge gas supplying source connected via the purge gas supplying tube. The frequency and power of the high frequency power in the plasma generating mechanism may be appropriately set in response to target reactivity. It may be possible to decrease a film forming temperature since the plasma gas has high reactivity even in the decreased film forming temperature. The plasma is not necessarily generated. When sufficient reactivity is maintained, the film may be formed with thermal CVD.

The carbon gas (source gas) may be any as long as carbon is formed by reaction. Typically, a treatment gas containing hydrocarbon (CH system) may be used. The treatment gas containing hydrocarbon may be ethylene($C_2H_2$), methane ($CH_4$), ethane($C_2H_6$), acethylene($C_2H_2$), butyne($C_4H_6$), or the like. The treatment gas not containing hydrocarbon may be an inactive gas like an Ar gas, a hydrogen gas or the like.

In Embodiment 1, when the gaps in the resist pattern array 14b coated by the silicon oxide film 15 are embedded, a fluorohydrocarbon gas containing fluorine such as $CH_3F$, a fluorocarbon gas (CF system) such as $CF_4$, a mixed gas of a fluorohydrocarbon gas and a fluorocarbon gas, or the like may be used.

The inner pressure of the treatment container in forming the amorphous carbon film is preferably from 6667 to 666665 Pa. The substrate temperature in forming the amorphous carbon film is preferably 800 degree C. or less, more preferably from 600 to 700 degree C.

Next, the third step of step S16 is carried out. Referring to FIG. 2F, the carbon film 16 is removed from the upper portion of the resist pattern array 14b coated by the silicon oxide film 15, and the carbon film 16 is etched back to leave a part 16a of the carbon film in the gap of the resist pattern array 14b in step S16. The orders of the removal of the carbon film 16 and the etch-back of the carbon film 16 may be any of the following: (1) after the removal is carried out the etch-back is carried out; (2) after the etch-back is carried out the removal is carried out; and (3) the removal and the etch-back are simultaneously carried out.

The treatment gas used to etch back in step S16 may be a mixed gas of a CF system such as $CF_4$, $C_4F_8$, $CHF_3$, $CH_3F$, $CH_2F_2$ and an Ar gas or the like, a gas containing the mixed gas and an additive such as oxygen when necessary.

The etch back process in step S16 is an etching process. Because the surface of the carbon film is etched back in the thickness direction, it is specifically called an etch back process.

Next, the fourth step of step S17 is carried out. Referring to FIG. 2G, the remaining carbon film 16a illustrated in FIG. 2F is removed, and the silicon oxide film 15 coating the upper portion of the resist pattern array 14b is etched back to have a predetermined film thickness H4 in step S17. The orders of the removal of the carbon film 16 and the etch-back of the carbon film 16 may be any of the following: (1) after the removal is carried out the etch-back is carried out; (2) after the etch-back is carried out the removal is carried out; and (3) the removal and the etch-back are simultaneously carried out.

The etch back process in step S17 is an etching process. Because the surface of the silicon oxide film 15 is etched back in the thickness direction, it is specifically called an etch back process.

Referring to FIG. 2G, a pattern including a first mask pattern array 15c made from the silicon oxide film 15 is formed. The pattern includes the upper portion of the resist pattern array 14b exposed to the outside, a center portion 15a having a predetermined film thickness S3' and being provided between the resist pattern array 14b, and film sidewall portions 15b which have a predetermined film thickness H4 and a width D and sandwich the center portion 15a.

The treatment gas used to etch back in step S17 may be a mixed gas of a CF system such as $CF_4$, $C_4F_8$, $CHF_2$, $CH_3F$, $CH_2F_2$ and an Ar gas or the like, a gas containing the mixed gas and an additive such as oxygen when necessary.

The resist pattern array 14b is subjected to asking, and the first mask pattern array 15c made of the silicon oxide film 15 including the center portion 15a and the film sidewall portion 15b is formed on the anti-reflective coating film 13.

The line width of the first mask pattern array 15c is designated as S3, and the space width is designated as L3. As described, it is possible to form the line width S3 of the first mask pattern array 15c to be 90 nm, and the space width L3 to be 30 nm. Instead of the ashing process, it is possible to etch the resist pattern array 14b using plasma such as oxygen, nitrogen, hydrogen, and ammonia.

Referring to FIG. 2I, a sixth step as a second mask pattern array forming step is carried out in step S19. The center portion 15a is removed from the first mask pattern array 15c, and the silicon oxide film 15 is etched back to leave film sidewall portions 15b on both sides of the center portion 15a. A second mask pattern array including the m sidewall portions 15b is formed.

Referring to FIG. 2I, a treatment gas used to etch back in step S19 may be a mixed gas of a CF system such as $CF_4$, $C_4F_8$, $CHF_3$, $CH_3F$, $CH_2F_2$ and an Ar gas or the like, a gas containing the mixed gas and an additive such as oxygen when necessary.

The line width of the second mask pattern array 15b is designated as L1 and the space width of the second mask pattern array 15b is designated as S1. When the line width L3 of the resist pattern array 14b is 30 nm, the width S3' of the center portion 15a is 30 nm, and the width D of the film sidewall portion 15b is 30 nm, since L1=D and S1=L3=S3', L1 becomes 30 nm and S1 becomes 30 nm.

Next, a third mask pattern array forming step is carried out in step S20. Referring to FIG. 2I and FIG. 2J, the anti-reflective coating film 13 is etched using the second mask pattern array 15b in step S20. A third mask pattern array 13a made of the anti-reflective coating film 13 and extending in one direction is formed. The line width of the mask pattern array 13a is designated as L1, and the space width of the mask pattern array 13a is designated as S1. All or a part of the film sidewall portion 15b is left on an upper portion of the third mask pattern array 13a.

Referring to FIG. 2K, a seventh step as a fourth mask pattern array forming step is carried out in step S21. Referring to FIG. 2K, the etched film 11 is processed using the third mask pattern array 13a to form a fourth mask pattern array 11a in step S21. The etched film containing silicon nitride may be etched by gas plasma of $Cl_2$, $Cl_2+HBr$, $Cl_2+O_2$, $CF_4+O_2$, $SF_6$, $Cl_2+N_2$, $Cl_2+HCl$, and $HBr+Cl_2+SF_6$.

Figure 3:
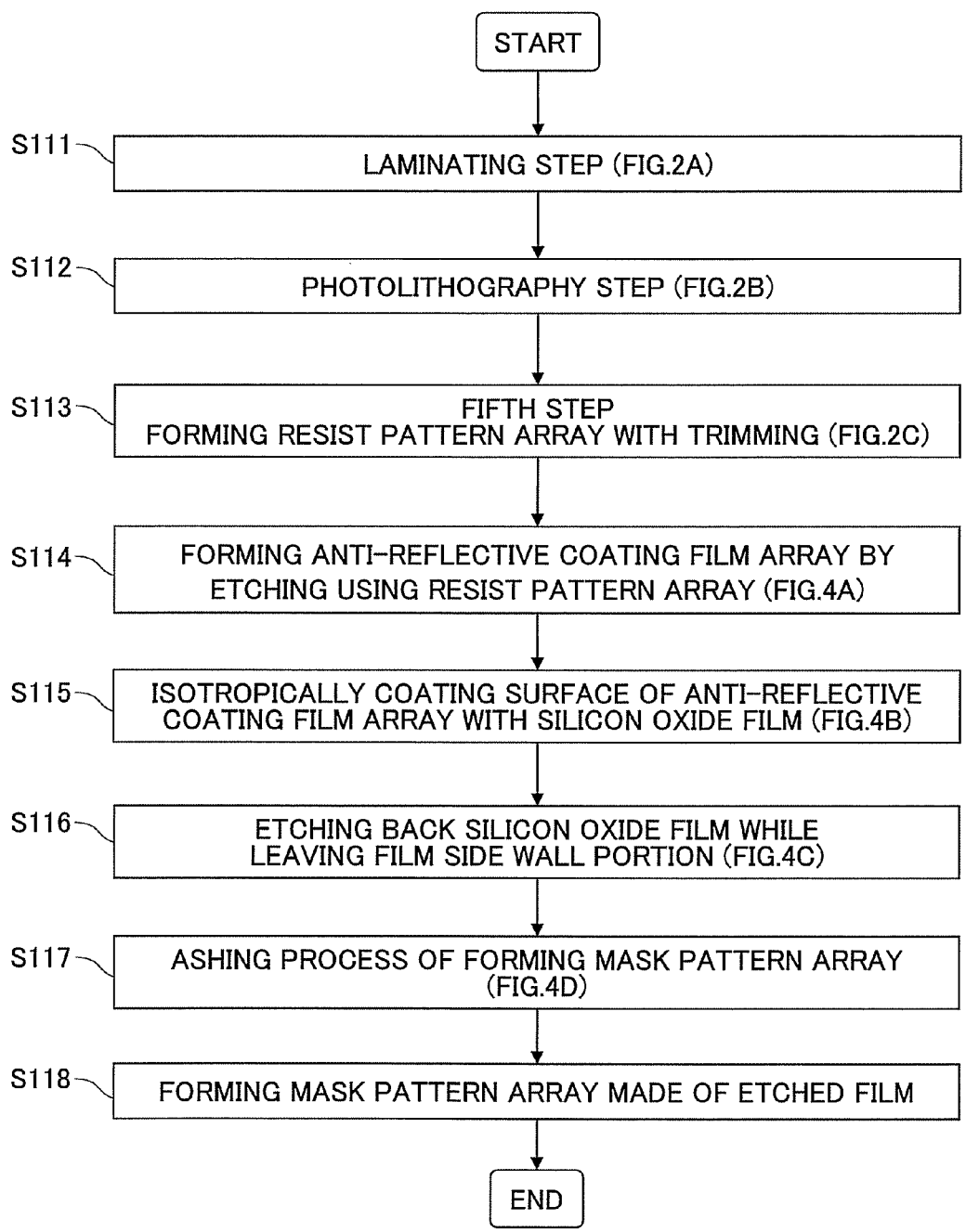
FIG. 3 is a flowchart for explaining a mask pattern forming method and a manufacturing method of a semiconductor device of Comparative Example 1.

Referring to FIG. 3 and FIG. 4 and comparing Embodiment 1 with Comparative Example 1, functions and effects of omitting the etching process of the anti-reflective coating film are described when a micro mask pattern is formed by a SWP method utilizing the mask pattern forming method and the manufacturing method of the semiconductor device of Embodiment 1.

Figure 4A:
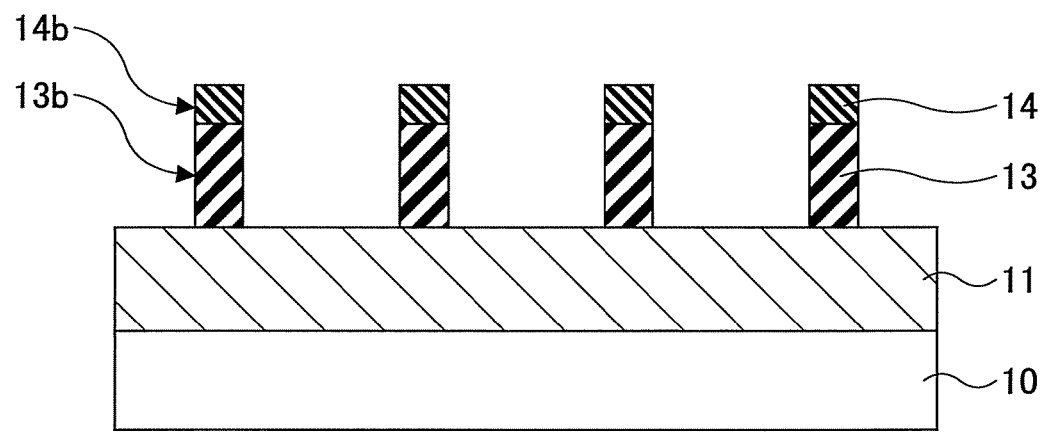
FIG. 4A schematically illustrates a structure of the substrate surface in the mask pattern forming method and the manufacturing method of the semiconductor device of Comparative Example 1.

FIG. 3 is a flowchart for explaining a mask pattern forming method and a manufacturing method of a semiconductor device of Comparative Example 1. FIG. 4A schematically illustrates a structure of the substrate surface in cross-section in the mask pattern forming method and the manufacturing method of the semiconductor device of Comparative Example 1.

Referring to FIG. 3, the mask pattern forming method and the manufacturing method of the semiconductor device have steps S111 to S118, and steps S111 to S113 are similar to steps S11 to S13 illustrated in FIG. 1.

In Comparative Example 1, steps S114 to S118 are carried out instead of steps S14 or later. The structures of the substrates surfaces after the processes of step S114 to step S117 are carried out respectively correspond to the cross-sectional views of FIG. 4A to FIG. 4D.

Figure 4B:
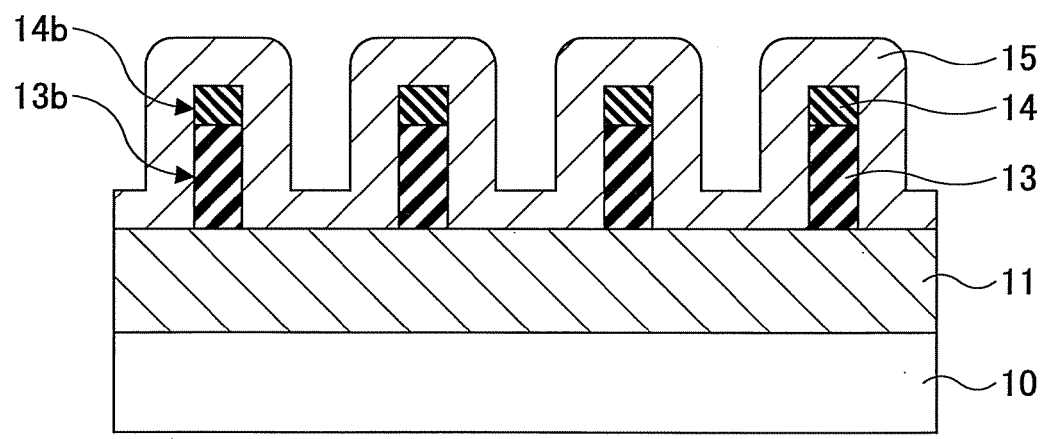
FIG. 4B schematically illustrates a structure of the substrate surface in the mask pattern forming method and the manufacturing method of the semiconductor device of Comparative Example 1.
Figure 4C:
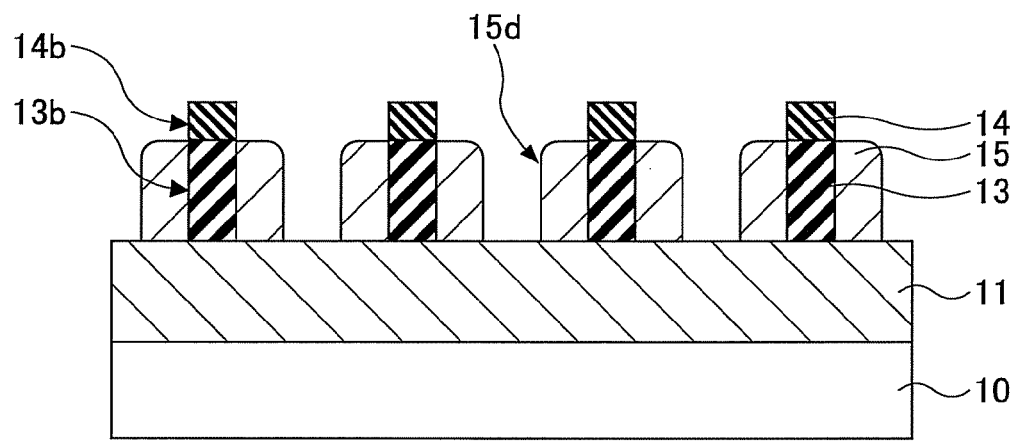
FIG. 4C schematically illustrates a structure of the substrate surface in the mask pattern forming method and the manufacturing method of the semiconductor device of Comparative Example 1.
Figure 4D:
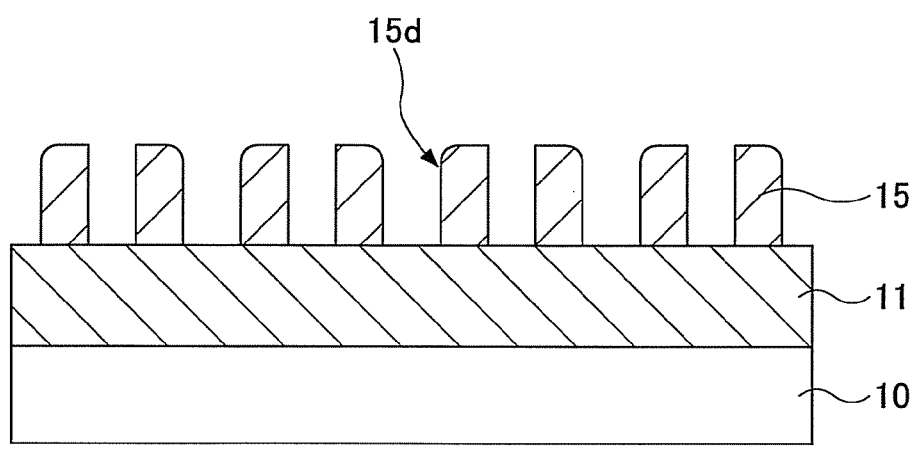
FIG. 4D schematically illustrates a structure of the substrate surface in the mask pattern forming method and the manufacturing method of the semiconductor device of Comparative Example 1.

Referring to FIG. 4A, the anti-reflective coating film 13 is etched using the resist pattern array 14b in step S114, and an anti-reflective coating film array 13b made of the anti-reflective coating film 13 is formed. Referring to FIG. 4B, the surface of the anti-reflective coating film pattern array 13b is isotropically coated by the silicon oxide film 15 in step S115. All or a part of the resist pattern array 14b may be left on an upper portion of the reflective coating film pattern array 13b in step S115. Referring to FIG. 4C, the silicon oxide film 15 is removed from the upper portion of the anti-reflective coating film pattern array 13b. Then, an etch back process is carried out to leave a film sidewall portion 15d of the anti-reflective coating film pattern array 13b. Referring to FIG. 4D, the anti-reflective coating film pattern array 13b is subjected to an asking process to thereby form the mask pattern array 15d made of the film sidewall portion 15d in step S117.

By carrying out steps S114 to S117, it is possible to form a mask pattern array made of the film sidewall portion 15d of the silicon oxide film 15. Thereafter, the etched film 11 is processed using the mask pattern array made of the film sidewall portion 15d to thereby form a mask pattern array made of the etched film 11.

In Comparative Example 1, the anti-reflective coating film 13 is etched using the resist pattern array 14b made of the resist film 14. On the other hand, in Embodiment 1, the anti-reflective coating film 13 is etched using the second mask pattern array 15b made of the silicon oxide film 15 in step S20.

In Embodiment 1, it is unnecessary to etch the anti-reflective coating film 11 before forming the silicon oxide film 15 in step S14 and after patterning the resist film 14 with photolithography in step S12. Therefore, it is possible to directly deliver the substrate 10 from the processing device for carrying out the photolithography to the film forming device for forming the silicon oxide film 15 without using an etching device. Said differently, it is possible to omit one step in comparison with Comparative Example 1. Therefore, it is possible in Embodiment 1 to reduce the production cost in the mask pattern forming method and the manufacturing method of the semiconductor device. In Comparative Example 1, it is required to select an anti-reflective coating film having a higher selection ratio than that of the resist film. For example, the anti-reflective coating film softer than the resist film is preferable. Therefore, the material of the anti-reflective coating film is limited and the production cost increases. In Embodiment 1, there is no limit in selecting the material and an ordinary anti-reflective coating film can be used. Therefore, it is possible to reduce the production cost.

Further, in Embodiment 1, there is no limit in the thickness of the anti-reflective coating film, and an anti-reflective coating film thicker than that in the conventional technique may be used. Therefore, the anti-reflective coating film can be used as a hard mask effective for etching the etched film. Specifically, in Comparative Example 1, the film thickness of the anti-reflective coating film is about 30 nm. In Embodiment 1, the film thickness can be increased up to about 80 nm.

Next, functions and effects of preventing the mask pattern made of the film sidewall portion from falling down (collapsing) when the micro mask pattern is formed by the SWP method using the mask pattern forming method and the manufacturing method of the semiconductor device are described.

Figure 6A:
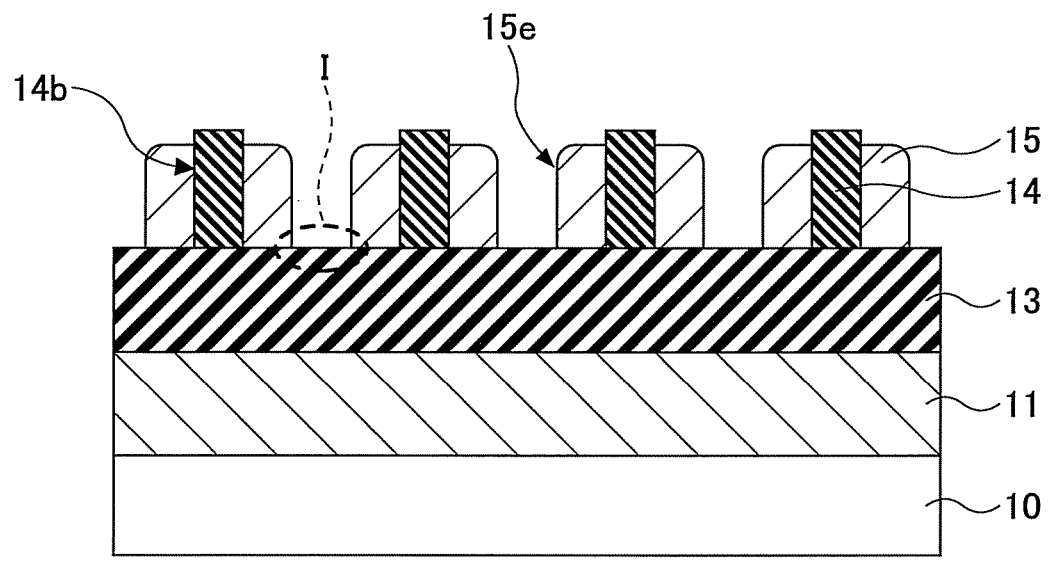
FIG. 6A schematically illustrates a structure of the substrate surface in the mask pattern forming method and the manufacturing method of the semiconductor device of Comparative Example 2.
Figure 6B:
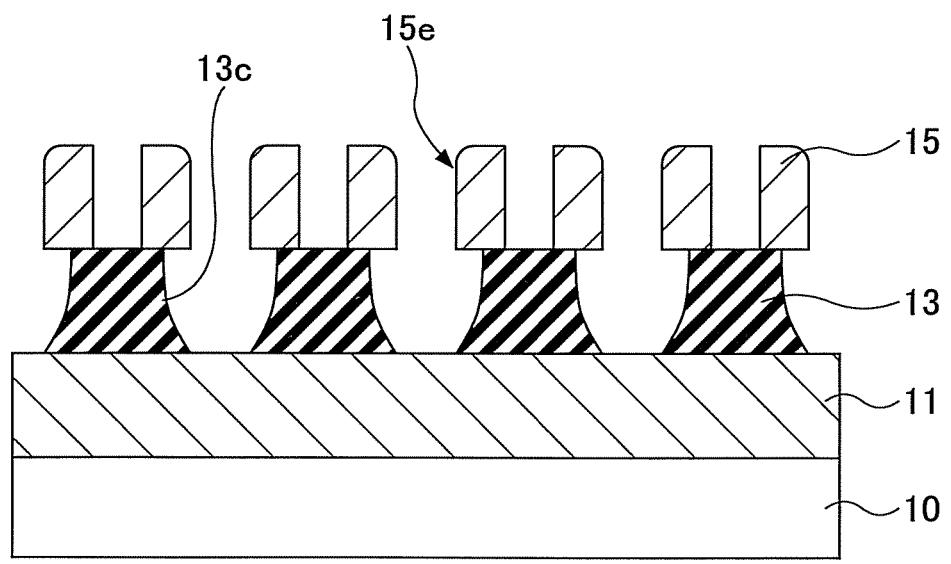
FIG. 6B schematically illustrates the structure of the substrate surface in the mask pattern forming method and the manufacturing method of the semiconductor device of Comparative Example 2.

FIG. 5 is a flowchart for explaining a mask pattern forming method and a manufacturing method of a semiconductor device of Comparative Example 2. FIG. 6A and FIG. 6B schematically illustrate structures of the substrate surface in cross-section in a mask pattern forming method and a manufacturing method of a semiconductor device of Comparative Example 2.

Referring to FIG. 5, the manufacturing method of the semiconductor device and the mask pattern forming method of the mask pattern have steps S211 to S218, and steps S211 to S214 are similar to steps S11 to S14 illustrated in FIG. 1.

In Comparative Example 2, steps S215 to S218 are carried out instead of steps S15 or later. The structures of the substrates surfaces after the processes of step S215 and step S216 are carried out respectively correspond to the cross-sectional views of FIG. 6A and FIG. 6B.

Referring to FIG. 6A, the silicon oxide film 15 is removed from the upper portion of the resist pattern array 14b. Then, an etch back process is carried out to leave a film sidewall portion 15e of the resist pattern array 14b. Referring to FIG. 6B, the resist pattern array 14b is subjected to an ashing process to thereby form a second mask pattern array made of the film sidewall portion 15e.

Steps S217 and S218 are similar to steps S20 and S21 illustrated in FIG. 1.

In Comparative Example 2, since the silicon oxide film 15 is etched back in step S215, the silicon oxide film 15 is removed in the region I surrounded by a dashed line to expose the anti-reflective coating film 13 to the outside. In step S216, the exposing anti-reflective coating film 13 is eroded by an ashing process with gas plasma containing oxygen or the like in the region I. The erosion of the anti-reflective coating film 13 proceeds in the film thickness direction and a direction parallel to the film surface as illustrated in FIG. 6B. The anti-reflective coating film 13 beneath the second mask pattern array made of the film sidewall portion 15e of the silicon oxide film 15 is eroded to thereby form a cavity portion 13c. Therefore, the second mask pattern array made of the film sidewall portion 15e may fall down, i.e. so-called pattern collapse occurs.

Meanwhile, in Embodiment 1, there is no region where the anti-reflective coating film 13 is exposed to the outside when the first mask pattern array forming step in step S18 is carried out from the state illustrated in FIG. 2G. Therefore, there is no erosion of the anti-reflective coating film 13 and no pattern collapse of the second mask pattern array made of the film sidewall portion 15b.

Next, functions and effects of enabling the continuously carrying out of the fifth step and the first step inside the film forming device for forming the silicon oxide film in the mask pattern forming method and the manufacturing method of the semiconductor device are described.

In the mask pattern forming method of Embodiment 1, the photolithography step of step S12 is carried out, and the substrate 10 having the pattern 14a made of the resist film 14 is introduced into the film forming device in which the silicon oxide film 15 is to be formed in the first step of step S14. Next, the fifth step of forming the resist pattern array 14b is carried out by trimming the shape of the pattern 14a inside the film forming device using the gas plasma containing oxygen or the ozone gas. Then, the surface of the slimmed resist pattern array 14b is isotropically coated in step S14.

Referring to FIG. 2B to FIG. 2D, the width L2 of the pattern 14a made of the resist film 14 decreases to the width L3 of the resist pattern array 14b. The width L3 of the resist pattern array 14b increases to L3'=L3+D×2 by coating both sides of the resist pattern array 14b with the silicon oxide film 15 having the thickness D. Further, it is possible to independently fine adjust a slimming time T13 in step S13 and a film forming time T14 in step S14. Specifically, the film forming time of the silicon oxide film in step S14 may be adjusted in response to a slimming amount in step S13. In a case of MLD, the film forming time may be adjusted by adjusting a number of repeated times to supply a silicon source gas and a gas containing oxygen.

Therefore, a ratio between the slimming time T13 and the film forming time T14 is independently finely adjusted, and the width L3 and the film thickness D are freely finely adjusted. Therefore, it is possible to equalize the width S3' of the center portion 15a, the width D of the film sidewall portion 15b, and the space width L3 of the first mask pattern array 15c in the first mask pattern array forming step of step S18.

Next, functions and effects of continuously carrying out the second step and the third step inside the processing device for etching back a carbon film in the mask pattern forming method and the manufacturing method of the semiconductor device are described.

As described, there may be a case where the gas of a CHF system, the gas of a CF system, and the mixed gas of the gas of the CHF system and the gas of the CF system in order to embed the gaps in the resist pattern array 14b coated by the resist pattern array 14.

On the other hand, when the film is formed by a Chemical Vapor Deposition (CVD) method using only the gas of the CH system, since the step selectivity is ordinarily high in the CVD method, the surface of the resist pattern array 14b is isotropically coated by the silicon oxide film 15. Therefore, it is difficult to embed the gaps of adjacent arrays of the resist pattern array 14b coated by the silicon oxide film 15.

However, in Embodiment 1, the carbon film is formed while changing the gas of the CHF system and the gas of the CF system into plasma inside the processing device in which the carbon film is etched back. Therefore, it is possible to deposit the carbon film by forming the carbon film and etching the formed carbon film at the same time. By controlling the gas flow rate, the pressure in the treatment container, and the high frequency power used for changing the gas to the plasma, it is possible to set conditions in which etching is dominant in the upper portion of the resist pattern array 14b and film formation is dominant in the gap between adjacent arrays of the resist pattern array 14b. Therefore, it is possible to form the carbon film so as to embed the carbon film in the gaps of the resist pattern array 14b coated by the silicon oxide film 15.

Further, it is possible to continuously carry out steps S15 to S21 in an etching processing device as described below.

Referring to FIG. 7 and FIG. 8, it is described that the etched film having a good shape can be processed. Evaluation results of shapes of the first mask pattern array 15c made of the silicon oxide film 15 and the fourth mask pattern array 11a made of the etched film 11 are described.

As Embodiment 1, steps S11 to S21 described in FIG. 1 are carried out. The conditions of steps S15 to S21 in Embodiment 1 are described.

(A) Step S15 (Second step)
Processing gas (Gas flow rate): $CH_3F$ (50 sccm)/$CF_4$ (250 sccm)
Substrate temperature: No heating
Inner pressure of film forming device: 20 mTorr
Processing time: 60 sec High frequency power (Upper electrode/Lower electrode): 600/600 W(B) Step S16 (Third step) Processing gas (Gas flow rate): $CF_4$ (170 sccm)/$O_2$ (30 sccm)
Substrate temperature: No heating
Inner pressure of film forming device: 100 mTorr
Processing time: 25 sec
High frequency power (Upper electrode/Lower electrode): 600/100 W (C) Step S17 (Fourth step)
Processing gas (Gas flow rate): $C_4H_8$ (40 sccm)/$O_2$ (10 sccm)
Substrate temperature: No heating
Inner pressure of film forming device: 40 mTorr
Processing time: 40 sec
High frequency power (Upper electrode/Lower electrode): 600/600 W (D) Step S18 (First mask pattern array forming step)
Processing gas (Gas flow rate): $O_2$ (100 sccm)
Substrate temperature: No heating
Inner pressure of film forming device: 20 mTorr
Processing time: 20 sec
High frequency power (Upper electrode/Lower electrode): 600/30 W (E) Step S19 (Sixth step)
Processing gas (Gas flow rate): $C_4H_8$ (30 sccm)/$CF_4$ (170 sccm)
Substrate temperature: No heating
Inner pressure of film forming device: 20 mTorr
Processing time: 20 sec
High frequency power (Upper electrode/Lower electrode): 600/100 W (F) Step S20 (Third mask pattern array forming step)
Processing gas (Gas flow rate): $CH_3F$ (50 sccm)/$CF_4$ (100 sccm)
Substrate temperature: No heating
Inner pressure of film forming device: 20 mTorr
Processing time: 10 sec
High frequency power (Upper electrode/Lower electrode): 600/100 W (G) Step S21 (Seventh step)
Processing gas (Gas flow rate): $CHF_3$ (90 sccm)/$CF_4$ (240 sccm)/$O_2$ (8 sccm)
Substrate temperature: No heating
Inner pressure of film forming device: 90 mTorr
Processing time: 45 sec
High frequency power (Upper electrode/Lower electrode): 300/200 W FIG. 7A and FIG. 7B include photographs of the first mask pattern array 15c after step S18 of Embodiment 1 (the above item (D)) taken by a scanning electron microscope (SEM). FIG. 7A is the photograph in a cross-sectional front view of the first mask pattern array 15c, and a schematic illustration of the photograph. FIG. 7B is the photograph in a substantially plan view of the first mask pattern array 15c, and a schematic illustration of the photograph.

Referring to FIG. 7, after carrying out step S18 in Embodiment 1 (the above item (D)), the first mask pattern array 15c made of the silicon oxide film 15 including the center portion 15a and the film sidewall portion 15b has a good shape.

FIG. 8 is a photograph of the fourth mask pattern array 11a after step S21 of Embodiment 1 (the above item (G)) taken by the scanning electron microscope (SEM). FIG. 8A is a photograph in a cross-sectional front view of the fourth mask pattern array 11a, and a schematic illustration of the photograph. FIG. 8B is a photograph in a substantially plan view of the fourth mask pattern array 11a, and a schematic illustration of the photograph.

Referring to FIG. 8A and FIG. 8B, after carrying out step S21 in Embodiment 1 (the above item (G)), the fourth mask pattern array 11a made of the etched film 11 has a good shape. The line width of the fourth mask pattern array 11a in Embodiment 1 is about 10 nm. Therefore, it is clear that the mask pattern having a size much smaller than the resolution limit of the photolithographic technique is provided.

The reason why the fourth mask pattern array 11a has a good shape is that a line width roughness (LWR), which is a variation of the line widths at plural portions along a line portion of the first mask pattern array 15c after step S18 is carried out, is small as illustrated in FIG. 7. When the LWR of the first mask pattern array 15c becomes small, the LWR of the second mask pattern array 15b and the LWR of the third mask pattern array 13a are also decreased. As a result, the LWR of the fourth mask pattern array 11a becomes small.

As described, the mask pattern forming method and the semiconductor manufacturing method of Embodiment 1 enables omitting the etching process of the anti-reflective coating film and prevent the mask pattern made of the film sidewall portion from falling down by coating the surface of the resist pattern array with the silicon oxide film and further coating the surface of the silicon oxide film with the carbon film in the case where the micro mask pattern is formed by the SWP method.

Embodiment 2

Figure 9:
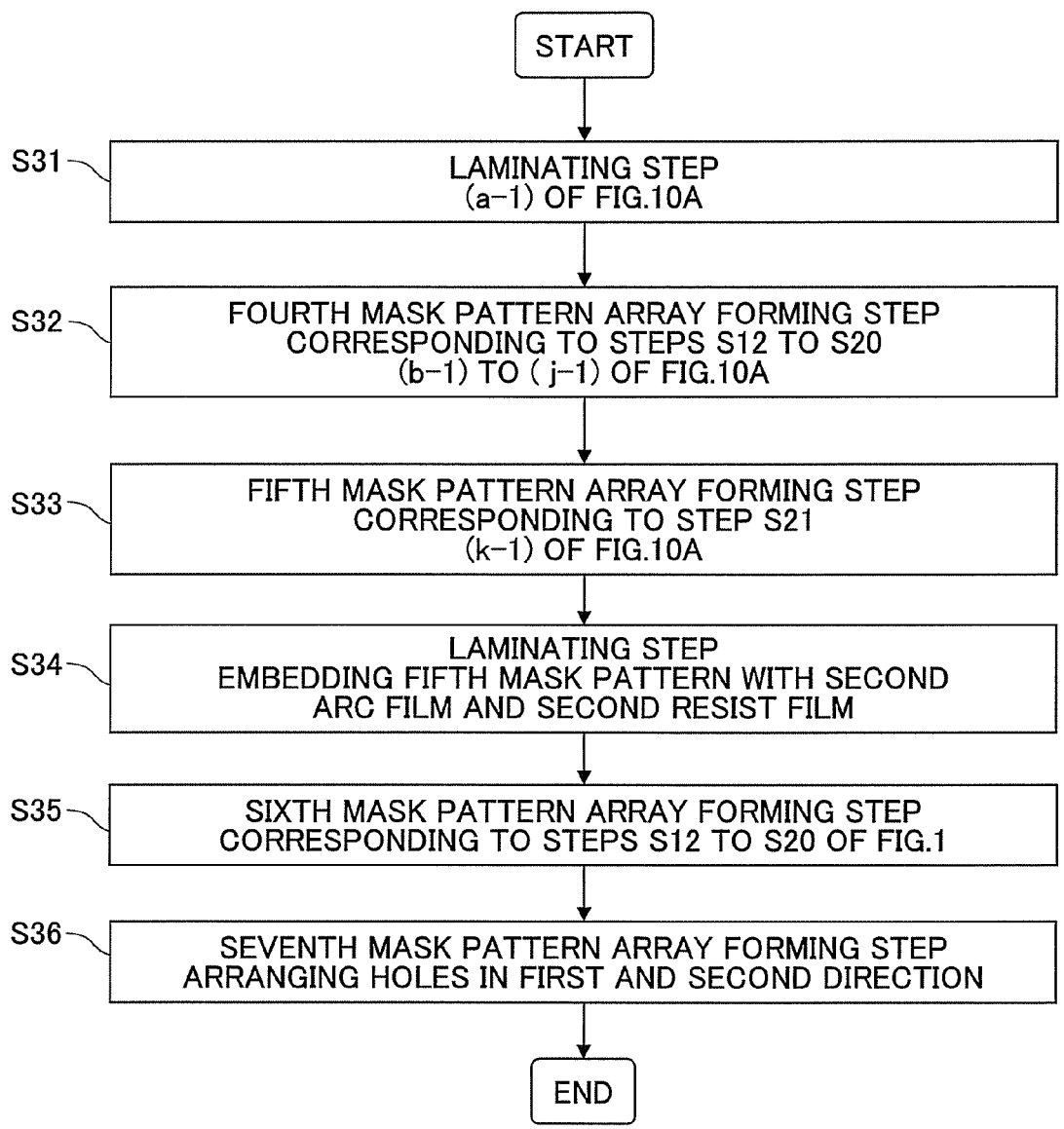
FIG. 9 is a flowchart for explaining a mask pattern forming method and a manufacturing method of a semiconductor device of Embodiment 2.

FIG. 9 is a flowchart for explaining the mask pattern forming method and the manufacturing method of the semiconductor device of Embodiment 2. FIG. 10A to FIG. 10E schematically illustrate structures of the substrate surfaces in cross-section in the mask pattern forming method and the manufacturing method of the semiconductor device. Hereinafter, the same reference symbols are attached to the same portions and description of these portions is omitted.

Embodiment 2 differs from Embodiment 1 at a point that the mask pattern forming methods of Embodiment 1 are carried out two times, and a hole is formed in the etched film.

Referring to FIG. 9, the mask pattern forming methods and the manufacturing method of the semiconductor device of Embodiment 1 includes a laminating step of step S31, a fourth mask pattern array forming step of step S32, a fifth mask pattern array forming step of step S33, a laminating step of step S34, a sixth mask pattern array forming step of step S35, and a seventh mask pattern array forming step of step S36.

First, the laminating step of step S31 is carried out. Referring to (a-1) of FIG. 10A, a first etched film 11, a second etched film 12, a first anti-reflective coating film 13, and a first resist film 14 are sequentially formed to be laminated in this order on a substrate 10 in step S31. The substrate 10, the first etched film 11, the first anti-reflective coating film 13, and the first resist film 14 of Embodiment 2 are similar to the substrate 10, the first etched film 11, the first anti-reflective coating film 13, and the first resist film 14 of Embodiment 1, respectively.

The second etched film 12 functions as a mask for various processes by forming a pattern in a direction perpendicular to a pattern to be formed on the first etched film 11. The material of the second etched film 12 may be silicon nitride, silicon oxide, silicon oxynitride, amorphous silicon, or polysilicon. The selection ratio of the first etched film 11 is preferably higher than the selection ratio of the second etched film 12. Therefore, the material of the second etched film 12 is preferably different from the material of the first etched film 11. The first etched film 11 may be silicon nitride film, and the second etched film 12 may be amorphous silicon.

The thicknesses of the first etched film 11 and the second etched film 12 may be 20 to 200 nm.

Referring to FIG. 2H, the fourth mask pattern array forming step is carried out in step S32. In step S32, steps S12 to S20 illustrated in FIG. 1 are carried out to form the fourth mask pattern array 13a extending in the first direction and being made of the first anti-reflective coating film 13. The fourth mask pattern array 13a of Embodiment 2 corresponds to the third mask pattern in FIG. 1. The structure of the substrate surface after carrying out steps S12 to S20 corresponds to cross-sectional views (b-1) to (j-1) of FIG. 10A.

Next, the fifth mask pattern array forming step is carried out in step S33. In step S33, step S21 illustrated in FIG. 1 is carried out to form the fifth mask pattern array 12a extending in the first direction and being made of the second etched film 12. The fourth mask pattern array 12a of Embodiment 1 corresponds to the fourth mask pattern in FIG. 1. The structure of the substrate surface after carrying out step S33 corresponds to a cross-sectional view (k-1) of FIG. 10A.

In step S34, after removing the first anti-reflective coating film 13 as illustrated in (l-1) of FIG. 10B, a second anti-reflective coating film 23 and a second resist film 24 are laminated so as to embed the fifth mask pattern array 12a as illustrated in (a-2) of FIG. 10B. The view (l-1) is a cross-sectional view of a plan view (l-11) taken along a line A-A in FIG. 10B. A view (a-21) of FIG. 10B is a cross-sectional view of the plan view (l-11) taken along a line B-B in FIG. 10B. A view (a-22) of FIG. 10B is a cross-sectional view of the plan view (l-11) taken along a line C-C in FIG. 10B.

Next, a sixth mask pattern array forming step is carried out in step S35. In step S35, steps S12 to S20 illustrated in FIG. 1 are carried out to form a sixth mask pattern array 23a extending in the first direction and being made of the second anti-reflective coating film 23. The sixth mask pattern array 23a of Embodiment 2 corresponds to the third mask pattern in FIG. 1. Cross-sectional views along the line B-B of the structure of the substrate surface after carrying out steps S12 to S20 correspond to cross-sectional views (b-21) to (j-21) of FIG. 10C. Cross-sectional views along the line C-C of the structure of the substrate surface after carrying out steps S12 to S20 correspond to cross-sectional views (b-22) to (j-22) of FIG. 10D.

Figure 10A:
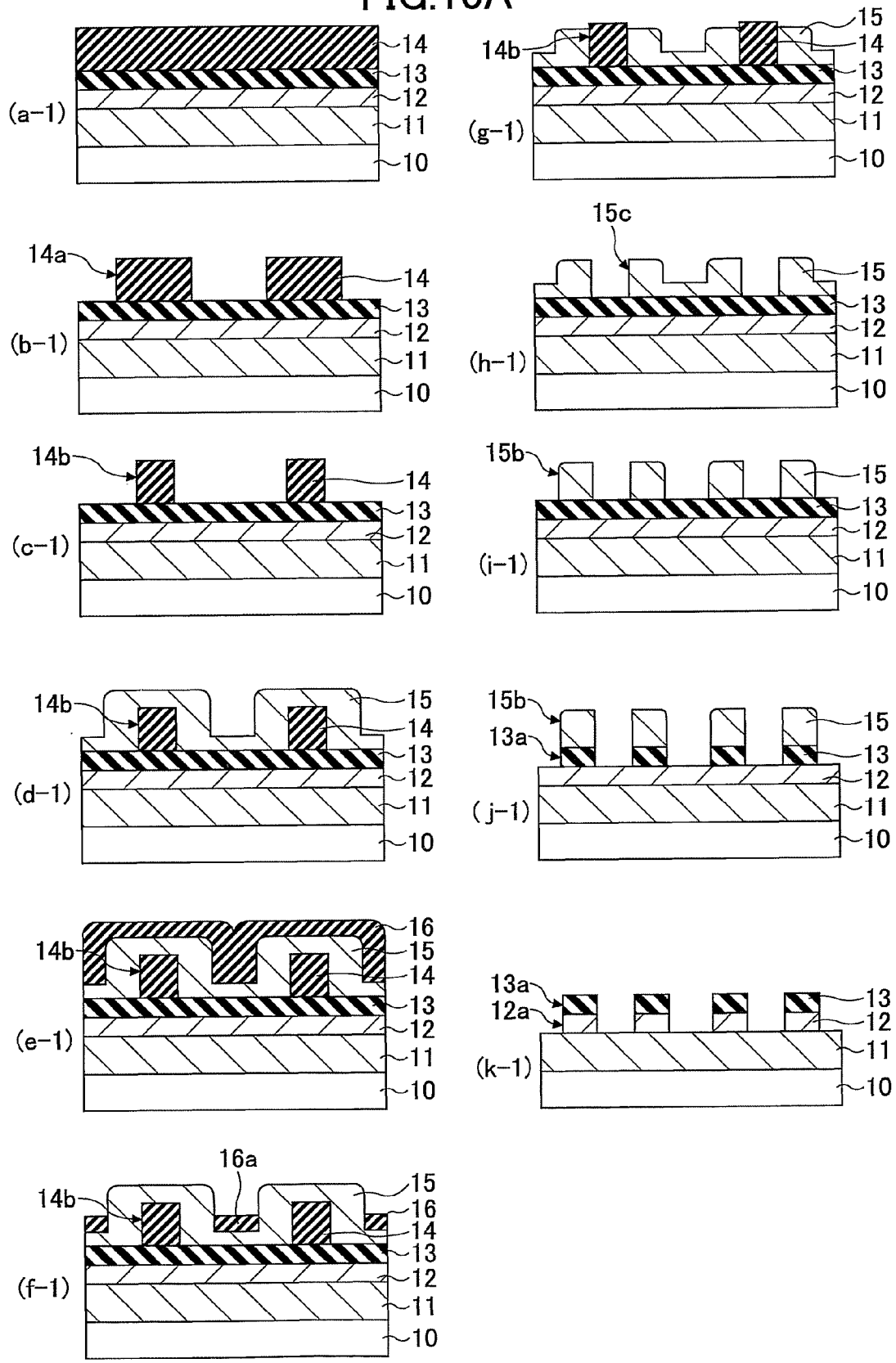
FIG. 10A schematically illustrates a structure of the substrate surface in the mask pattern forming method and the manufacturing method of the semiconductor device of Embodiment 2.
Figure 10C:
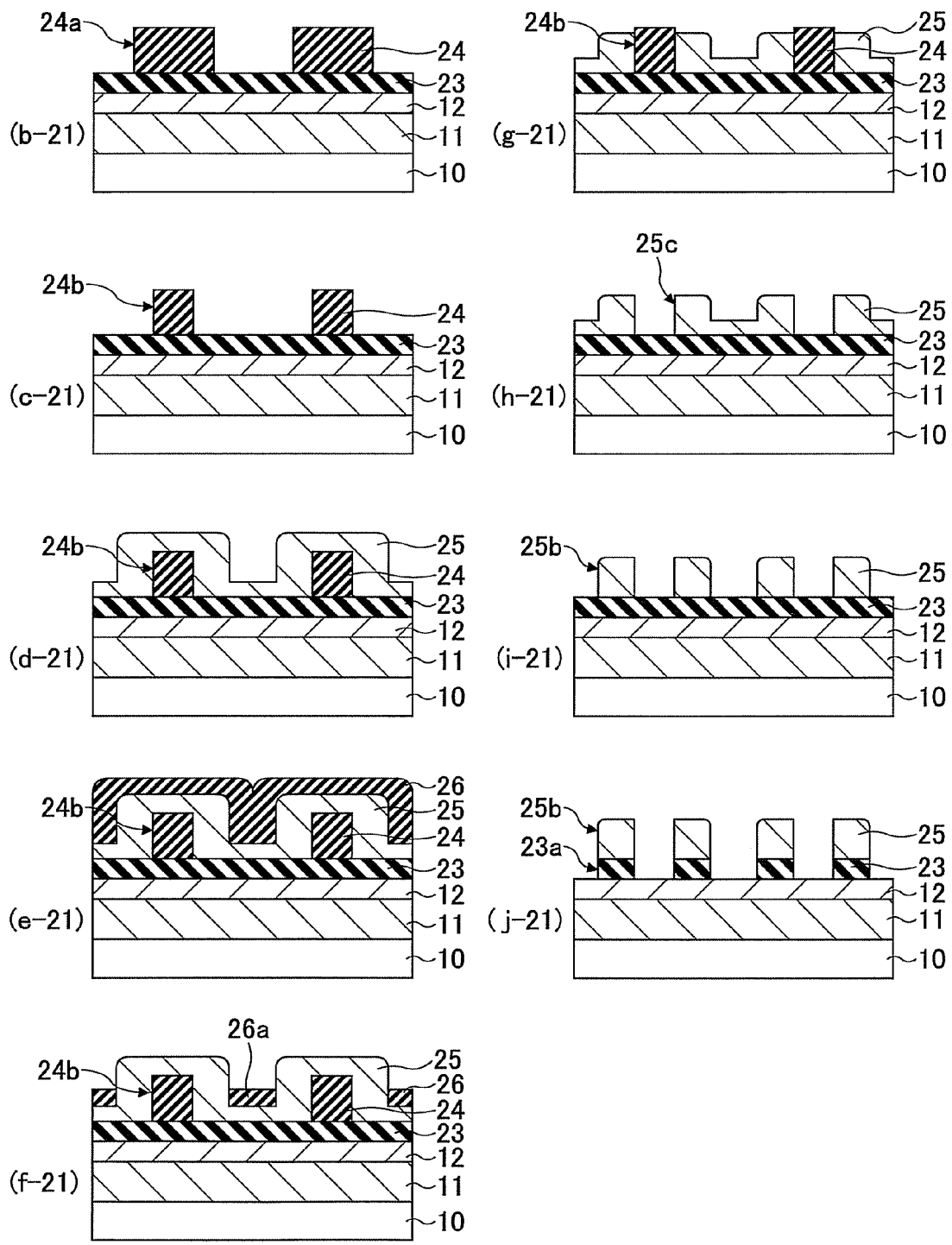
FIG. 10C schematically illustrates the structure of the substrate surface in the mask pattern forming method and the manufacturing method of the semiconductor device of Embodiment 2.
Figure 10D:
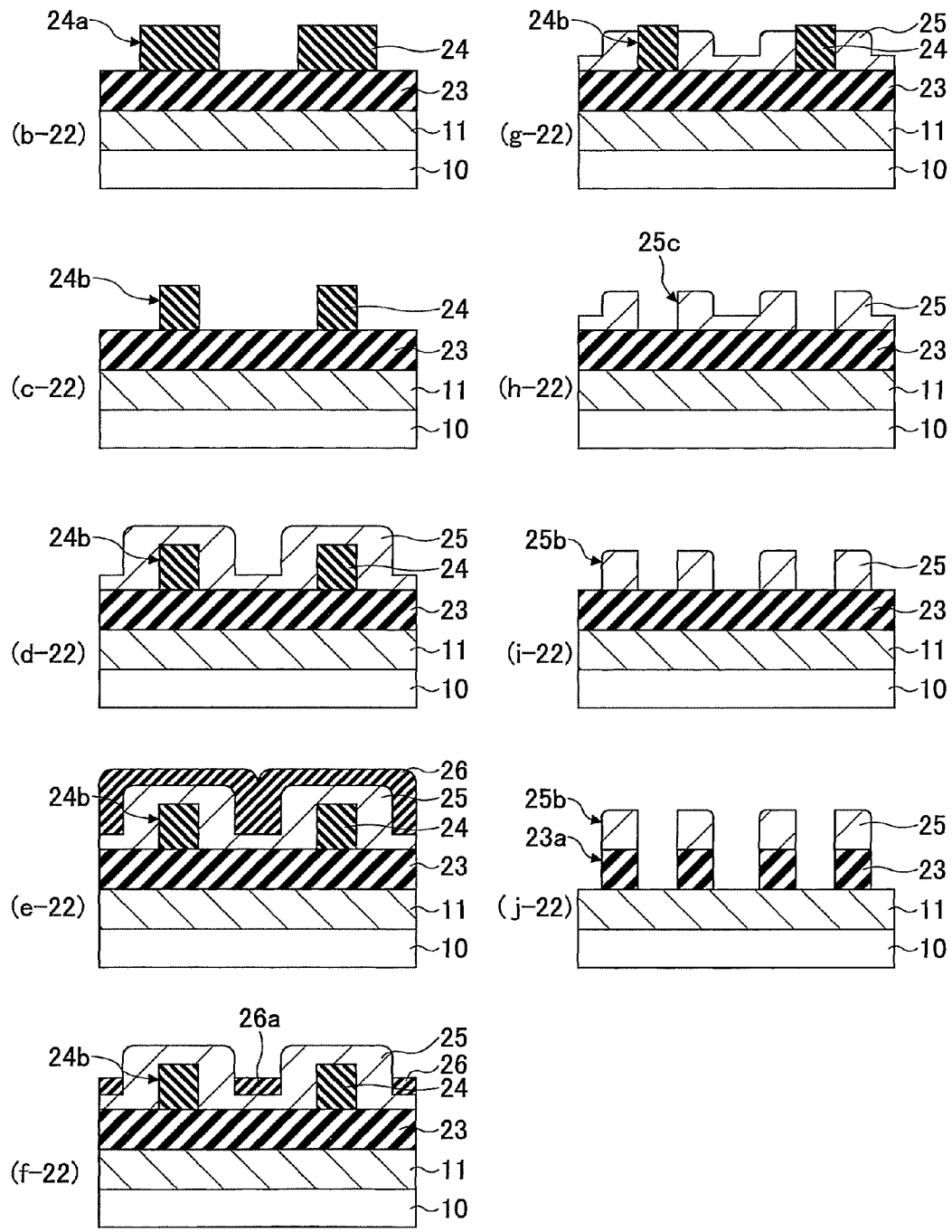
FIG. 10D schematically illustrates the structure of the substrate surface in the mask pattern forming method and the manufacturing method of the semiconductor device of Embodiment 2.

Referring to FIG. 10C and FIG. 10D, a pattern made of the second resist film 24 is referred to as 24a; a resist pattern array made of the second resist film 24 obtained by slimming the pattern 24a is referred to as 24b; a silicon oxide film is referred to as 25; a film sidewall portion made of the silicon oxide film 25 is referred to as 25b;
a first mask pattern array made of the silicon oxide film 25 is referred to as 25c; a carbon film is referred to as 26; and the remaining carbon film is referred to as 26a.

In step S36, the first etched film 11 is processed using the fifth mask pattern array 12a and the sixth mask pattern array 23a to thereby form the seventh pattern array 11b having holes 11b arranged in the first and second directions.

Figure 10E:
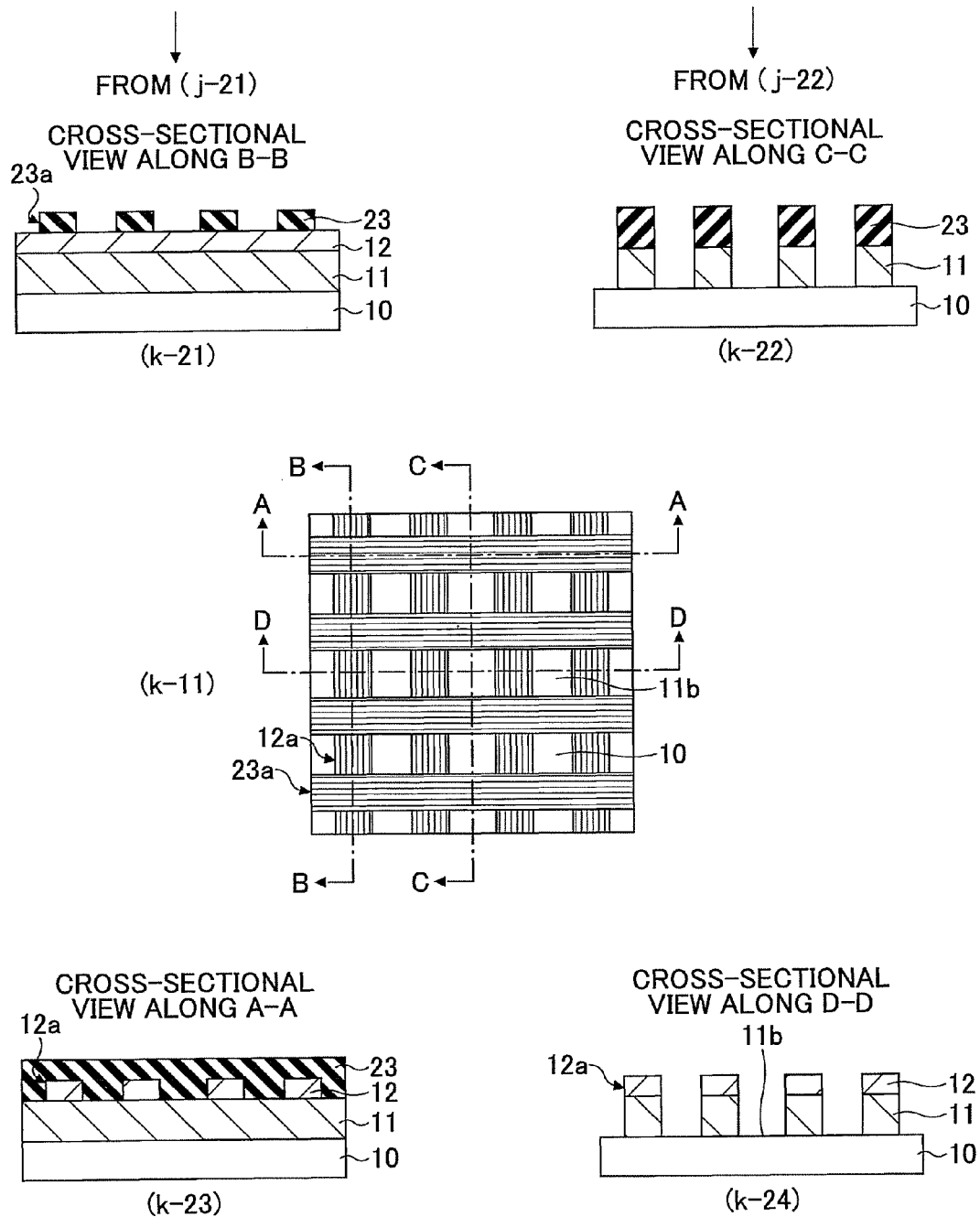
FIG. 10E schematically illustrates the structure of the substrate surface in the mask pattern forming method and the manufacturing method of the semiconductor device of Embodiment 2.

Views (k-21), (k-22), (k-23), and (k-24) of FIG. 10E are cross-sectional views of a plan view (k-11) of FIG. 10E taken along respectively lines B-B, C-C, A-A, and D-D.

Thus, it becomes possible to form the holes 11b arranged like a matrix in the first and second directions on the first etched film 11. The angle between the first and second directions may be 90 degrees or other angles.

The mask pattern forming method and the manufacturing method of the semiconductor device of Embodiment 2 are the same as Embodiment 1 at points that the surface of the resist pattern array is isotropically coated by the silicon oxide film, the silicon oxide film is coated by the carbon film, and the carbon film is etched back. Therefore, it is possible to omit an etching process of the anti-reflective coating film, the anti-reflective coating film is used as an effective mask pattern in etching the etched film, and the mask pattern made of the film sidewall portion can be prevented from falling down or collapsing.

Modified Example of Embodiment 2

Figure 12B:
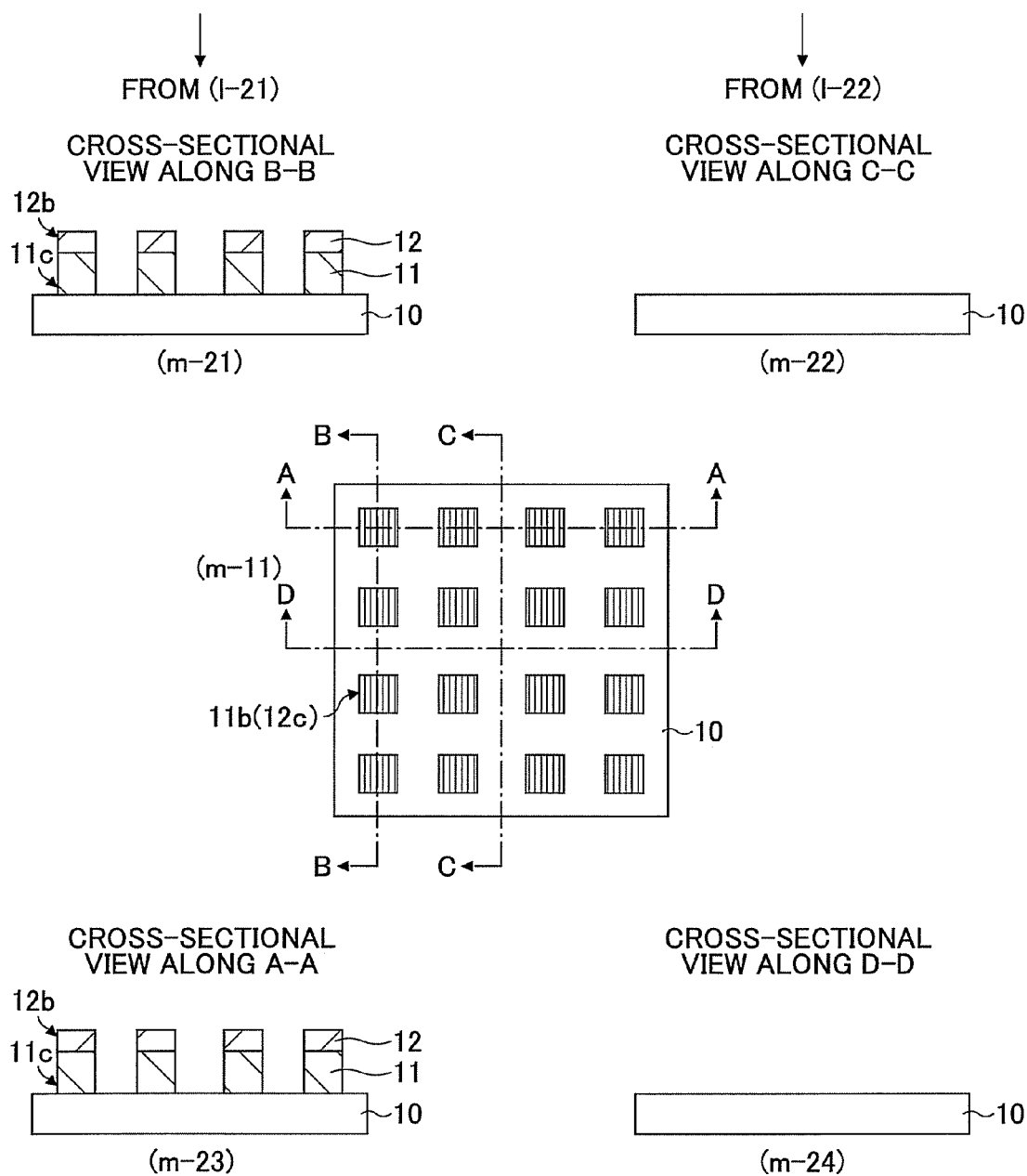
FIG. 12B schematically illustrates the structure of the substrate surface in the mask pattern forming method and the manufacturing method of the semiconductor device of the modified example of Embodiment 2.

Referring to FIG. 11 to FIG. 12B, a mask pattern forming method and a manufacturing method of a semiconductor device of Modified Example of Embodiment 2 are described.

FIG. 11 is a flowchart for explaining the manufacturing method of the semiconductor device and the mask pattern forming method for forming the mask pattern of Modified Example of Embodiment 2. FIG. 12A and FIG. 12B schematically illustrate structures of the substrate surfaces in cross-section in the mask pattern forming method and the manufacturing method of the semiconductor device in Modified Example of Embodiment 2.

Modified Example of Embodiment 2 differs from Embodiment 2 at a point that dots or pillars are formed instead of the holes.

Referring to FIG. 11, the mask pattern forming methods and the manufacturing method of the semiconductor device of Embodiment 1 includes a laminating step of step S41, a fourth mask pattern array forming step of step S42, a fifth mask pattern array forming step of step S43, a laminating step of step S44, a sixth mask pattern array forming step of step S45, a seventh mask pattern array forming step of step S46, and an eighth mask pattern array forming step of step S47.

Steps S41 to S45 in Modified Example of Embodiment 2 are similar to steps S31 to S35 of Embodiment 2 described in reference of FIG. 9. Cross-sectional views of structures of the substrate surface after step S45 is carried out taken along the lines B-B and C-C on the view (l-11) of FIG. 10B correspond to the structures illustrated in the view (j-21) of FIG. 10C and the view (j-22) of FIG. 10D.

Next, the seventh mask pattern array forming step is carried out in step S46 in Modified Example of Embodiment 2. In step S46, the fifth mask pattern array 12a is processed using the sixth mask pattern array 23a, and the seventh mask pattern array 12b having dots arranged in the first and second directions is formed as illustrated in FIG. 12A.

Views (l-21), (l-22), (l-23), and (l-24) of FIG. 12A are cross-sectional views of a plan view (l-11) of FIG. 12A taken along respectively lines B-B, C-C, A-A, and D-D.

Next, an eighth mask pattern array forming step is carried out in step S47. In step S47, the first etched film 11 is processed using the seventh mask pattern 12b to thereby form the eighth mask pattern array 11c as illustrated in FIG. 12B.

Views (m-21), (m-22), (m-23), and (m-24) of FIG. 12B are cross-sectional views of a plan view (m-11) of FIG. 12B taken along respectively lines B-B, C-C, A-A, and D-D.

All or a part of the seventh mask pattern array 12b may be left on an upper portion of the eighth mask pattern array 11c after step S47 is carried out.

As described, the dots or the pillars made of the first etched film and arranged like a matrix in the first and second directions are formed. The angle between the first and second directions may be 90 degrees or other angles.

The mask pattern forming method and the manufacturing method of the semiconductor device of Modified Example of Embodiment 2 are the same as Embodiment 1 at points that the surface of the resist pattern array is isotropically coated by the silicon oxide film, the silicon oxide film is coated by the carbon film, and the carbon film is etched back. Therefore, it is possible also in Modified Example of Embodiment 2 to omit an etching process of the anti-reflective coating film, the anti-reflective coating film is used as an effective mask pattern in etching the etched film, and the mask pattern made of the film sidewall portion can be prevented from falling down or collapsing.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A mask pattern forming method comprising:
   a first step of isotropically coating a surface of a resist pattern array, which is formed on an anti-reflective coating film and has a predetermined line width with a silicon oxide film until a gap in the resist pattern array becomes a predetermined size;
   a second step of coating the surface of the resist pattern array coated by the silicon oxide film with a carbon film to embed the gap in the resist pattern array coated by the silicon oxide film with the carbon film;
   a third step of etching back the carbon film to partly remove the carbon film from the surface of the resist pattern array coated by the silicon oxide film while leaving the carbon film within the gap in the resist pattern array coated by the silicon oxide film, wherein the etching back the carbon film is carried out in any order;
   a fourth step of etching back a portion of the silicon oxide film positioned above a top portion of the resist pattern array so that the resist pattern array is exposed from the silicon oxide film, and the silicon oxide film has a predetermined film thickness and the carbon film left within the gap in the third step is removed, wherein the etching back the portion of the silicon oxide film above the resist pattern array is carried out in any order; and
   a first mask pattern array forming step of forming the first mask pattern array of first mask patterns each of which is made of the silicon oxide film, which has a center portion having a predetermined width and sidewalls sandwiching the center portion in a width direction, and is alternately arranged with a space width substantially the same as the predetermined line width on the anti-reflective coating film by applying an ashing process to the resist pattern array exposed through the silicon oxide film to completely remove the resist pattern array so that the anti-reflective coating film is exposed from the silicon oxide film.

2. The mask pattern forming method according to claim 1, wherein the second step and the third step are sequentially carried out inside a processing device in which the carbon film is etched back.

3. The mask pattern forming method according to claim 2, wherein the carbon film contains amorphous carbon.

4. The mask pattern forming method according to claim 3, wherein a first treatment gas containing any one of a gas of a CF system, a gas of a CHF system, and a gas of CH system is supplied, in the second step, to coat the surface of the resist pattern array coated by the silicon oxide film with the carbon film to embed the gap in the resist pattern array coated by the silicon oxide film with the carbon film.

5. The mask pattern forming method according to claim 4, wherein the first treatment gas contains $CH_3F$ or $CF_4$.

6. The mask pattern forming method according to claim 1, further comprising:
   a fifth step of forming the resist pattern array by trimming a pattern of the resist film on the anti-reflective coating film,
   wherein the fifth step and the first step are sequentially carried out inside a film forming device.

7. The mask pattern forming method according to claim 1, wherein a source gas containing silicon and a gas containing oxygen are alternately supplied, in the first step, to isotropically coat the surface of the resist pattern array, which is formed on the anti-reflective coating film and has the predetermined line width, with the silicon oxide film until the gap in the resist pattern array coated by the silicon oxide film becomes the predetermined size.

8. The mask pattern forming method according to claim 1, wherein a second treatment gas containing any one of a gas of a CF system, a gas of a CHF system, a gas of a CH system, and an oxygen gas is supplied, in the third step, to etch back the carbon film to partly remove the carbon film from the surface of the resist pattern array coated by the silicon oxide film while leaving the carbon film within the gap in the resist pattern array coated by the silicon oxide film.

9. The mask pattern forming method according to claim 8, wherein the second treatment gas contains $CF_4$ or an oxygen gas.

10. The mask pattern forming method according to claim 1, wherein a third treatment gas containing any one of a gas of a CF system, a gas of a CHF system, a gas of a CH system, and an oxygen gas is supplied, in the fourth step, to etch back the upper portion of the resist pattern array so as to obtain the predetermined film thickness of the silicon oxide film and so as to remove the remaining carbon film.

11. The mask pattern forming method according to claim 10, wherein the third treatment gas contains $C_4F_8$ or an oxygen gas.

12. The mask pattern forming method according to claim 1, further comprising:
   a fifth step of forming a second mask pattern array made of the sidewalls which are left on the anti-reflective coating film by etching back the silicon oxide film so as to remove the center portion from the first mask pattern array.

13. The mask pattern forming method according to claim 12,
  wherein a fourth treatment gas containing any one of a gas of a CF system, a gas of a CHF system, and a gas of a CH system is supplied, in the fifth step.

14. The mask pattern forming method according to claim 13,
  wherein the fourth treatment gas contains $C_4F_8$ or $CF_4$.

15. The mask pattern forming method according to claim 12, further comprising:
  a third mask pattern array forming step of forming the third mask pattern array, which is made of at least the anti-reflective coating film, and extends in a direction by etching the anti-reflective coating film with the second mask pattern array.

* * * * *